United States Patent
Hur

(10) Patent No.: US 7,840,368 B2
(45) Date of Patent: *Nov. 23, 2010

(54) TEST CIRCUIT FOR PERFORMING MULTIPLE TEST MODES

(75) Inventor: Young Do Hur, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/959,392

(22) Filed: Dec. 18, 2007

(65) Prior Publication Data

US 2008/0278189 A1 Nov. 13, 2008

(30) Foreign Application Priority Data

May 10, 2007 (KR) .................. 10-2007-0045407

(51) Int. Cl.
*G01R 31/14* (2006.01)

(52) U.S. Cl. .............. 702/120; 702/78; 702/110; 702/117

(58) Field of Classification Search .......... 702/78–79, 702/110, 117–122, 176, 178, 183, 188; 324/602, 324/603, 609, 765
See application file for complete search history.

(56) References Cited

U.S. PATENT DOCUMENTS

| 4,441,183 | A | * | 4/1984 | Dussault ............... 714/732 |
| 5,349,562 | A | * | 9/1994 | Tanizaki ............... 365/222 |
| 5,796,745 | A | | 8/1998 | Adams et al. |
| 5,870,342 | A | * | 2/1999 | Fukuda ................. 365/201 |
| 6,343,048 | B1 | * | 1/2002 | Jung ................... 365/189.16 |
| 6,360,344 | B1 | | 3/2002 | Khoche et al. |
| 6,681,358 | B1 | | 1/2004 | Karimi et al. |
| 6,813,203 | B2 | * | 11/2004 | Nakagawa ............ 365/201 |
| 7,034,560 | B2 | | 4/2006 | Farnworth et al. |
| 2001/0009530 | A1 | * | 7/2001 | Maeda ................ 365/233 |
| 2001/0010651 | A1 | * | 8/2001 | Nakaya et al. ........ 365/201 |
| 2002/0034112 | A1 | * | 3/2002 | Kato et al. ............ 365/201 |
| 2003/0137308 | A1 | | 7/2003 | Wang |
| 2005/0251713 | A1 | | 11/2005 | Lee |
| 2006/0107160 | A1 | * | 5/2006 | Ricchetti et al. ...... 714/742 |

FOREIGN PATENT DOCUMENTS

| JP | 04098700 | 3/1992 |
| JP | 2001-296337 | 10/2001 |
| JP | 2002-022803 | 1/2002 |
| KR | 1020040005125 A | 1/2004 |
| KR | 1020050058872 A | 6/2005 |

* cited by examiner

*Primary Examiner*—Eliseo Ramos Feliciano
*Assistant Examiner*—Mi'schita' Henson
(74) *Attorney, Agent, or Firm*—Baker & McKenzie LLP

(57) ABSTRACT

A test circuit includes a first reset pulse generator configured to generate a first reset pulse when a test mode is performed or when power is up, a test mode maintenance signal generator configured to provide a test mode maintenance signal activated in response to a predetermined consecutive test information data, the activation of the test mode maintenance signal being controlled by the first reset pulse, a second reset pulse generator configured to generate a second reset pulse when the test information data is received as a predetermined test mode reset data or when power is up, and a test mode selection signal generator configured to receive the test information data provided from the test mode maintenance signal generator and the test mode maintenance signal and to generate a specific test mode selection signal, the activation of the specific test mode selection signal being controlled by the second reset pulse.

24 Claims, 16 Drawing Sheets

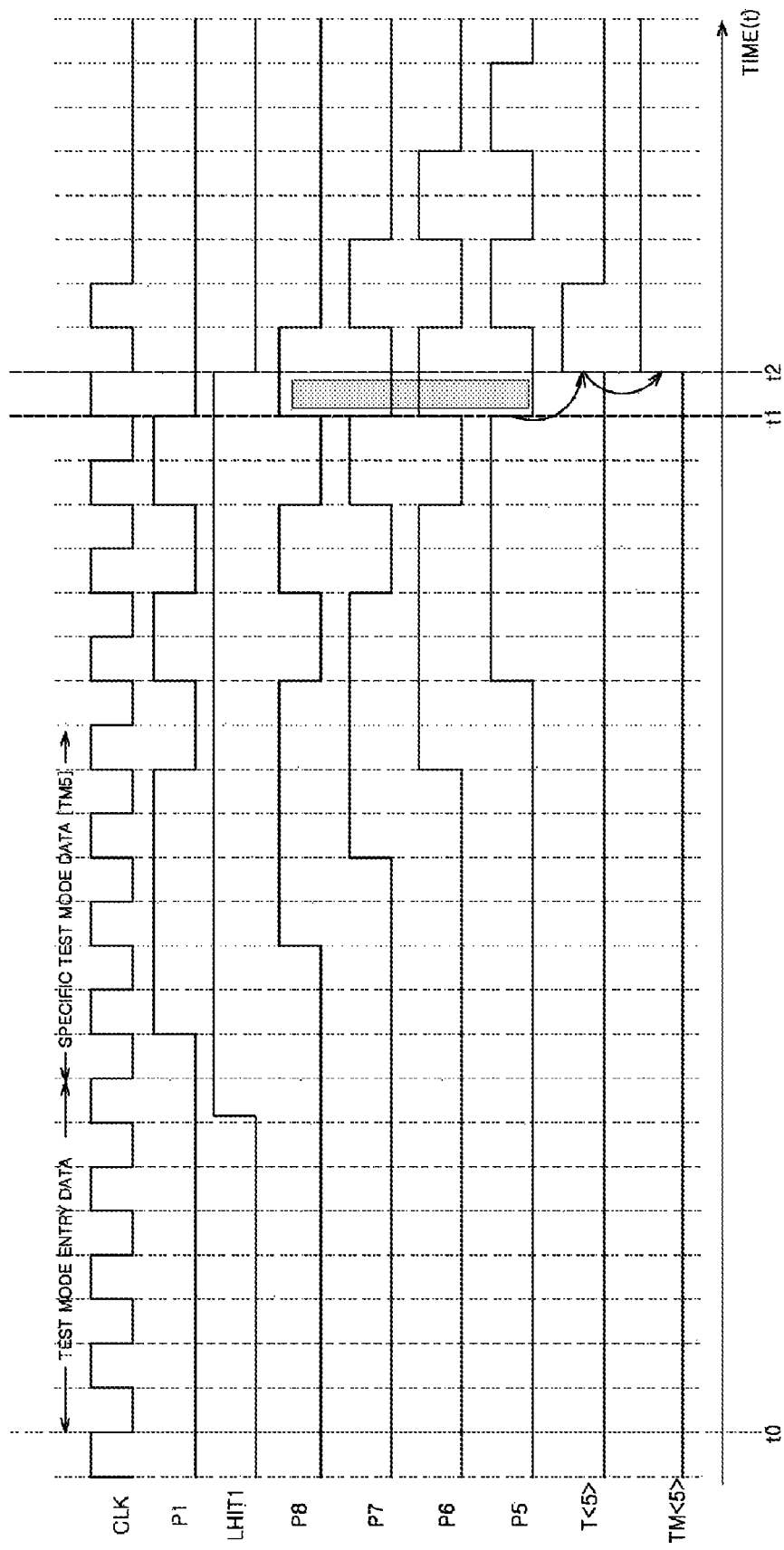

TEST CIRCUIT FOR PERFORMING MULTIPLE TEST MODES

CROSS-REFERENCES TO RELATED APPLICATION

The present application claims priority under 35 U.S.C. 119(a) to Korean Patent Application number 10-2007-0045407, filed on May 10, 2007, in the Korean Intellectual Property Office, the contents of which are incorporated herein by reference in their entirety as if set forth in full.

BACKGROUND

1. Technical Field

The disclosure relates to a test circuit for a semiconductor memory apparatus and, more particularly, to a test circuit for performing various test mode during testing of a semiconductor apparatus.

2. Related Art

Generally, after a semiconductor memory apparatus has been fabricated, a failure analysis is performed through a test process for ensuring the reliability of the semiconductor memory. That is, it must be verified whether or not the function and performance of the semiconductor memory satisfy design specifications. An error in a design and/or a failure in a process or the like is detected using the test process and associated failure analysis, thereby improving the reliability and productivity of the semiconductor memory.

However, the ability to achieve wide ranging failure analysis is restricted after the semiconductor memory apparatus is packaged, which is when conventional test processes are typically run. It would be preferable to develop a test process that can provide failure analysis of various types of signals using various test modes.

SUMMARY

According to one aspect, there is provided a test circuit including a first reset pulse generator configured to generate a first reset pulse when a test mode is performed or when power is up, a test mode maintenance signal generator configured to provide a test mode maintenance signal activated in response to a predetermined consecutive test information data, the activation of the test mode maintenance signal being controlled by the first reset pulse, a second reset pulse generator configured to generate a second reset pulse when the test information data is received as a predetermined test mode reset data or when power is up, and a test mode selection signal generator configured to receive the test information data provided from the test mode maintenance signal generator and the test mode maintenance signal and to generate a specific test mode selection signal, the activation of the specific test mode selection signal being controlled by the second reset pulse.

According to another aspect of the present invention, there is provided a test circuit comprising a first reset pulse generator configured to generate a first reset pulse when a test mode selection signal or a power-up signal is activated, and to have an active state maintained during an activation interval having a pulse width, a test mode maintenance signal generator for maintaining the activation state when a test information data is received as a predetermined test mode entry data and then generating a test mode maintenance signal reset by the first reset pulse, the test mode maintenance signal being in a reset state during the activation interval of the first reset pulse, a second reset pulse generator configured to generate a second reset pulse in response to the test information data when a reset detection signal or the power-up signal is activated, and a test mode selection signal generator configured to receive the test information data provided from the test mode maintenance signal generator during an interval at which the test mode maintenance signal is activated and to generate a specific test mode selection signal, the activated test mode selection signal being reset to be in a non-activation state by the second reset pulse.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 16 is a timing diagram illustrating the operation of the circuit illustrated in FIG. 8;

DETAILED DESCRIPTION

Figure 1:
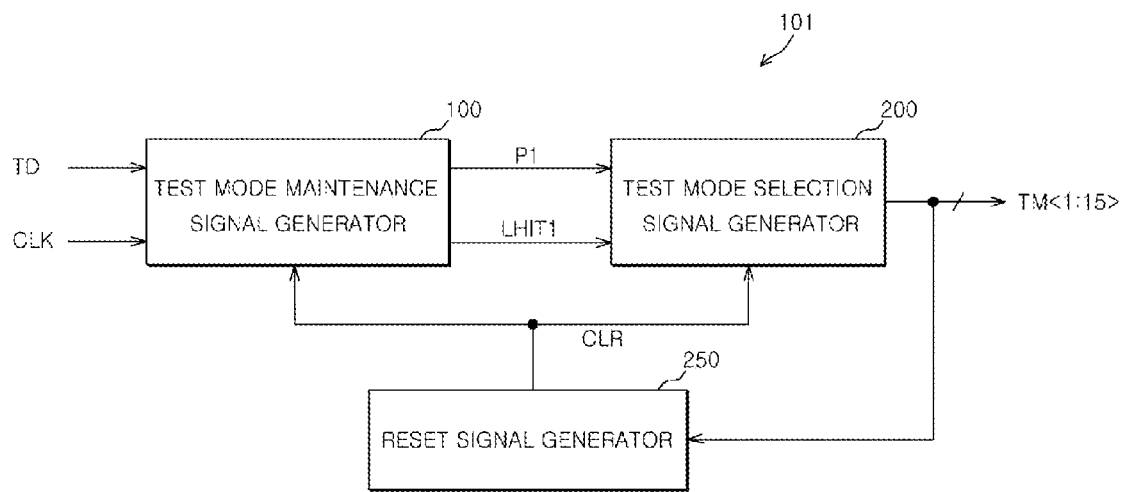
FIG. 1 is a block diagram of a test circuit according to one embodiment.

FIG. 1 is a diagram illustrating an example test circuit 101 configured in accordance with one embodiment. Referring to FIG. 1, the test circuit 101 can include a test mode maintenance signal generator 100, a test mode selection signal generator 200 and a reset signal generator 250.

The test mode maintenance signal generator 100 can be configured to receive test information data (TD) and a clock signal (CLK) to provide a test mode maintenance signal (LHIT1) for recognizing the test information data (TD), and the activation of the test mode maintenance signal (LHIT1) can be controlled by a reset signal (CLR).

Specifically, if the test information data (TD) received by the test mode maintenance signal generator 100 is predetermined test mode entry data, then the test mode maintenance signal generator 100 can provide the activated test mode maintenance signal (LHIT1). Then, the test information data (TD) can be recognized during an interval at which the test mode maintenance signal (LHIT1) is activated. The test mode maintenance signal (LHIT1) can be triggered and reset on the rising edge of the reset signal (CLR) as can the test information data (TD). The predetermined test mode entry data may be an arbitrary 4-bit data. However, the embodiments described herein are not necessarily limited thereto.

The test mode selection signal generator 200 can be configured to receive shifted test information data (P1) and the test mode maintenance signal (LHIT1) provided from the test mode maintenance signal generator 100. The test mode selection signal generator 200 generates a specific test mode selection signal (TM<1:15>), and the activation of the specific test mode selection signal (TM<1:15>), can be controlled by the reset signal (CLR). That is, a specific test mode signal can be selected from various test mode selection signals (TM<1:15>) by using the shifted test information data (P1) during an interval at which the test mode maintenance signal (LHIT1) is activated. The test mode signal (TM<1:15>) can also be triggered and reset at the rising edge of the reset signal (CLR).

If at least one test mode signal (TM<1:15>) is activated, the reset signal generator 250 can be configured to generate the reset signal (CLR). The reset signal (CLR) resets the test information data (TD) and the test mode maintenance signal (LHIT1) during an activation interval.

Figure 2:
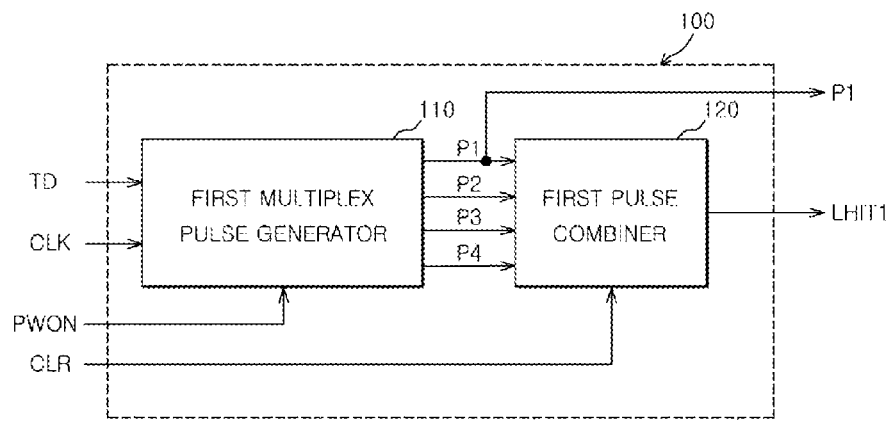
FIG. 2 is a block diagram of a test mode maintenance signal generator that can be included in the circuit illustrated in FIG. 1.

FIG. 2 is a diagram illustrating an example test node maintenance signal generator 100 configured in accordance with one embodiment. Referring to FIG. 2, the test mode maintenance signal generator 100 includes a first multiplex pulse generator 110 and a first pulse combiner 120.

The first multiplex pulse generator 110 can be configured to receive the test information data (TD) and the clock signal (CLK), and to generate a plurality of pulse signals (P1) to (P4) thereon. The first multiplex pulse generator 110 can be controlled by a power-up signal (PWON). The first multiplex pulse generator 110 can include a shift register for generating the plurality of pulse signals (P1) to (P4) as described with respect too FIG. 3A.

The first pulse combiner 120 can be configured to combine the plurality of the pulse signals (P1) to (P4) to provide the test mode maintenance signal (LHIT1). The first pulse combiner 120 can be controlled by the reset signal (CLR). That is, if the plurality of the pulse signals (P1) to (P4) received by the first pulse combiner 120 are predetermined test mode entry data, the first pulse combiner 120 can provide the test mode maintenance signal (LHIT1) in response to the predetermined test mode entry data. The first pulse combiner 120 may include a combining circuit, as described with respect to FIG. 3B, for receiving the plurality of the pulse signals (P1) to (P4).

Figure 3A:
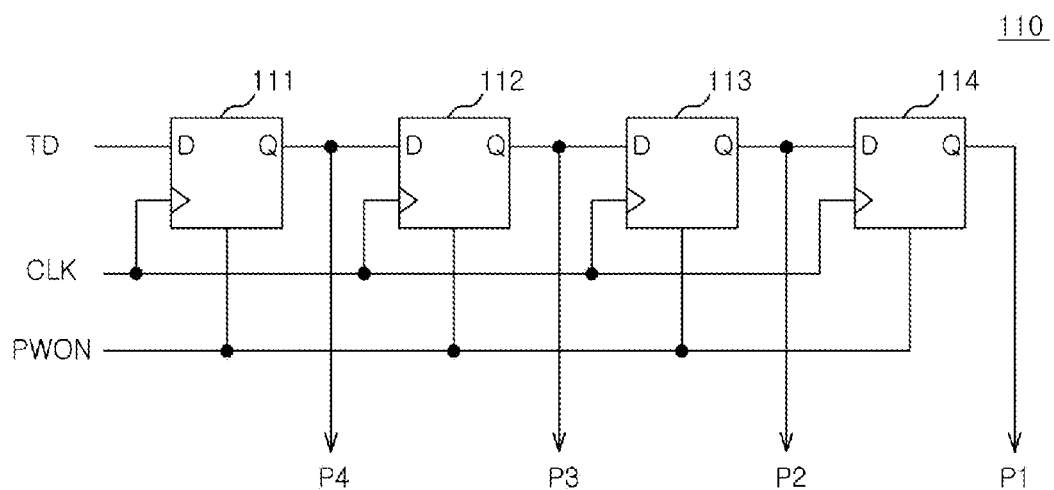
FIG. 3A is a circuit diagram of a first multiplex pulse generator in FIG. 2.

FIG. 3A is a diagram illustrating the first multiplex pulse generator 110 in more detail. Referring to FIG. 3A, the first multiplex pulse generator 110, can be configured to store the received test information data (TD) and sequentially shifts the stored test information data (TD) in synchronization with the clock signal (CLK) to generate the plurality of the pulse signals (P1) to (P4). In order to generate the four pulse signals the first multiplex pulse generator 110 can, e.g., includes four shift registers, which are connected in series with each other. Here, D flip flops are used as the shift registers. However, the embodiments described herein are not necessarily limited thereto.

Each of the D flip flops 111 to 114 has a clock terminal for receiving the clock signal (CLK), a terminal D for receiving the test information data (TD), and a reset terminal for receiving the power-up signal (PWON). The plurality of the pulse signals (P1) to (P4) are generated at respective output terminals Q of the four D flip flops 111 to 114, respectively.

In another embodiment, the test information data (TD) can be represented as 1-byte serial data. The first multiplex pulse generator 110 can include the four D flip flops 111 to 114, so the test information data (TD) transmitted for four clock periods has consecutive four bits. For convenience in illustration, (P1) first subjected to pulsing is referred to as a first pulse signal, and (P2), P3 and (P4) are sequentially referred to as second, third and fourth pulse signals in accordance with a generation order of the pulse signals. The D flip flops 111-114 are illustrated as transmitting data by triggering the data at a rising edge of a clock. However, the present embodiments described herein are not necessarily limited thereto.

For example, serial test information data could be received by the first D flip flop 111 as "LHHHLHLH". The first D flip flop 111 can be triggered at a rising edge of the clock signal (CLK), and thus data received at the terminal D is sequentially transmitted to the next D flip flop 112. Hence, the test information data (TD) triggered at every rising edge of the clock signal (CLK) can be sequentially transmitted. Meanwhile, the plurality of the pulse signals (P1) to (P4) provided from the first multiplex pulse generator 110 are triggered and reset at a rising edge of the power-up signal (PWON). Here, the power-up signal (PWON) is activated when power is up.

Figure 3B:
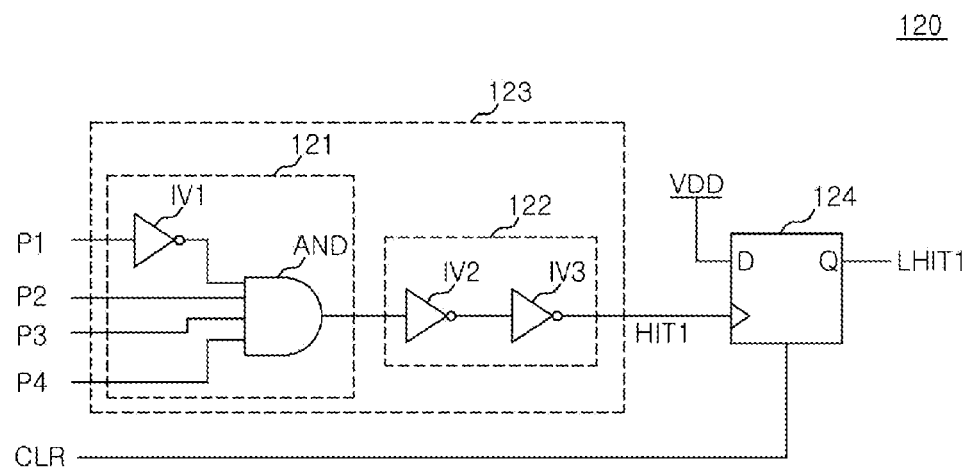
FIG. 3B is a circuit diagram of a first pulse combiner that can be included in the generator illustrated in FIG. 2.

FIG. 3B is a circuit diagram illustrating the first pulse combiner 120 in more detail. Referring to FIG. 3B, the first pulse combiner 120 can include a combiner 123 and a D flip flop 124. The combiner 123 can be configured to parallelize the serial pulse signals (P1) to (P4) to generate the test mode maintenance signal (LHIT1). More specifically, the combiner 123 can be configured to receive the plurality of the pulse signals (P1) to (P4), and if the received pulse signals (P1) to (P4) are predetermined test mode entry data, the combiner 123 can provide a test mode detection signal (HIT1). As illustrated, the combiner 123 can include a receiver 121 and a delay unit 122.

The receiver 121 can include a first inverter IV1 and an AND gate AND. The receiver 121 can receive the inversion signal of the first pulse signal (P1) and second to fourth pulse signals (P2) to (P4). When all the received signals are in a high level, i.e., predetermined test mode entry data LHHH, the receiver 121 can be configured to provide a high-level signal through an AND operation of the AND gate AND. Hence, the receiver 121 can provide a high-level signal having an activation interval only when the pulse signals (P1) to (P4) are received as "LHHH". If the signal passes through the delay unit 122, the test mode detection signal (HIT1) is generated. Although the delay unit 122 includes two inverters IV2 and IV3, the number of inverters may be increased or decreased so as to adjust a delay time as required by a specific implementation.

The D flip flop 124 can comprise a clock terminal for receiving the test mode detection signal (HIT1), a terminal D for receiving a supply power voltage (hereinafter, referred to as VDD), and a reset terminal for receiving the reset signal (CLR). Then, the D flip flop 124 can be triggered at a rising edge of the test mode detection signal (HIT1) to output the power level VDD to an output terminal Q. In other words, if the plurality of the pulse signals (P1) to (P4) are predetermined test entry mode data LHHH, the test mode detection signal (HIT1) is generated. The D flip flop 124 is triggered at a rising edge of the test mode detection signal (HIT1) such that the test mode maintenance signal (LHIT1) can be continuously maintained as a high-level signal. Meanwhile, the D flip flop 124 can be controlled by the reset signal (CLR). Hence, the test mode maintenance signal (LHIT1) can be maintained as a high-level signal that is in an activation state until the reset signal (CLR) is activated. As described above, the test circuit can recognize the test information data (TD) during an interval at which the test mode maintenance signal (LHIT1) is activated and perform a test process. The reset signal (CLR) will be described in detail with reference to FIGS. 4A and 4B.

Figure 4A:
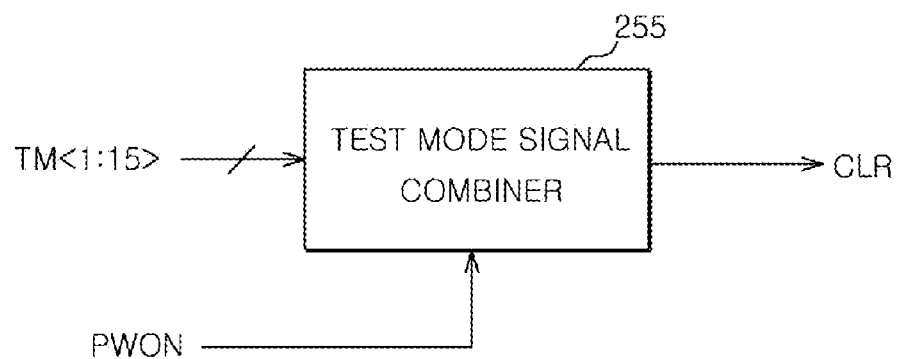
FIG. 4A is a block diagram of a reset signal generator that can be included in the circuit illustrated in FIG. 1.

FIG. 4A is a block diagram illustrating an example reset signal generator 250 in more detail. Referring to FIG. 4A, the reset signal generator 250 can include a test mode signal combiner 255. The reset signal generator 250 can be configured to receive all the test mode selection signals (TM<1:15>) to generate the reset signal (CLR) in response to a combined signal.

More specifically, the test mode signal combiner 255 can be configured to receive and combine all the test mode selection signals (TM<1:15>). Here, the test mode selection signals (TM<1:15>) can be generated by the combination of 4-bit signals, and $2^4$ test modes can be generated. In one embodiment, the test mode selection signals (TM<1:15>) can be obtained by combining other possible data except the predetermined test mode entry data described above. If at least one test mode selection signal (TM<1:15>) is activated, the test mode signal combiner 255 provides an activated clear signal (CLR).

Figure 4B:
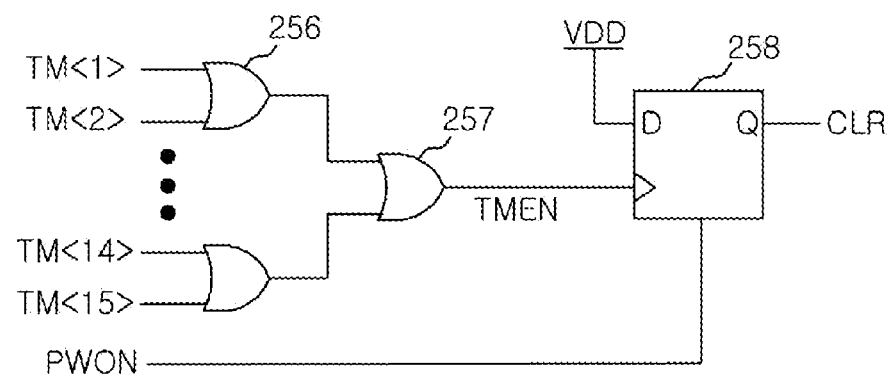
FIG. 4B is a circuit diagram of a test mode signal combiner that can be included in the generator illustrated in FIG. 4A.

FIG. 4B is a circuit diagram illustrating the test mode signal combiner 255 in more detail. Referring to FIG. 4B, the test mode signal combiner 255 can include a plurality of OR gates 256 and 257 and a D flip flop 258. The test mode signal combiner 255 can be configured to include the OR gates 256 and 257 for receiving and combining all the test mode signals (TM<1:15>). If at least one test mode selection signal (TM<1:15>) in the test mode signals (TM<1:15>) received by the OR gates 256 and 257 is activated, an activated test mode activation signal (TMEN) can be provided. In other words, the activated test mode activation signal (TMEN) can mean that at least one test mode is selected. The D flip flops can have a clock terminal for receiving the test mode activation signal (TMEN), a terminal D for receiving the power level VDD and a reset terminal for receiving the power-up signal (PWON). Here, the power-up signal (PWON) can be activated when power is up.

Accordingly, the test mode signal combiner 255 can output a high-level clear signal (CLR), which can be triggered and activated at a rising edge of the at least one activated test mode selection signal (TM<1:15>). The D flip flop 313 can be configured to latch the clear signal (CLR) of an activated high level until a rising edge of the next test mode activation signal (TMEN) is inputted into the D flip flop 313. Further, the D flip flop 313 can be configured to latch the clear signal (CLR) of a high level before the power-up signal (PWON) is activated.

Figure 5:
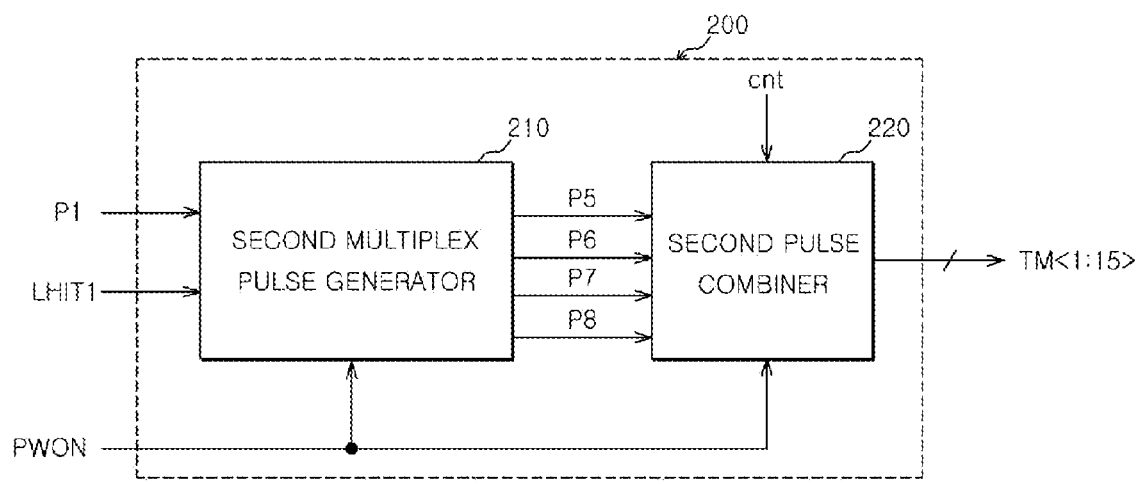
FIG. 5 is a block diagram of a test mode selection generator that can be included in the circuit illustrated in FIG. 1.

FIG. 5 is a block diagram illustrating the test mode selection generator 200 in more detail. Referring to FIG. 5, the test mode selection signal generator 200 can be configured to include a second multiplex pulse generator 210 and a second pulse combiner 220. The second multiplex pulse generator 210 can be configured to receive the first pulse signal (P1) can be generated by the first multiplex pulse generator (110 of FIG. 2), i.e., the shifted test information data, and the test mode maintenance signal (LHIT1) to generate pulse signals (P5) to (P8). The multiplex pulse generator 210 can be configured to be controlled by the power-up signal (PWON). Like the first multiplex pulse generator 110 described above, the second multiplex pulse generator 210 can also include a shift register for generating the pulse signals (P5) to (P8).

The second pulse combiner 220 can be configured to combine the pulse signals (P5) to (P8) to provide the test mode selection signal (TM<1:15>). The second pulse combiner 220 can be controlled by the power-up signal (PWON) and a counter pulse (CNT). That is, one activated test mode selection signal (TM<i>), where i=2 to 5, selected from the test mode selection signals (TM<1:15>) can be provided by the pulse signals (P5) to (P8) received by the second pulse combiner 220. The second pulse combiner 220 can be configured to include a decoder for decoding the pulse signals (P5) to (P8) and to generate the test mode selection signal (TM<1:15>).

Figure 6A:
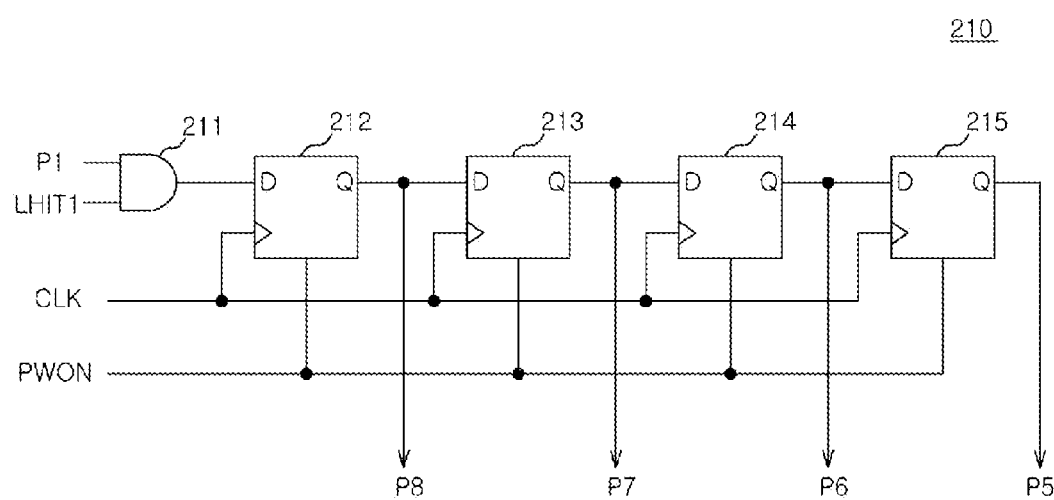
FIG. 6A is a circuit diagram of a second multiplex pulse generator that can be included in the generator illustrated in FIG. 5.

FIG. 6A is a circuit diagram illustrating the second multiplex pulse generator 210 in more detail. Referring to FIG. 6A, the second multiplex pulse generator 210 can be configured to include an AND gate 211 and a plurality of D flip flops 212 to 215. The second multiplex pulse generator 210 can be configured to store a signal obtained by combining the first pulse signal (P1) and the test mode maintenance signal (LHIT1) and to sequentially shift the stored signal in synchronization with the clock signal (CLK) so as to generate the pulse signals (P5) to (P8). Here, the second multiplex pulse generator 210 can be configured to include four D flip flops 212 to 215, which are connected in series so as to generate the plurality of the pulse signals (P5) to (P8).

While the test mode maintenance signal is maintained as a high-level signal that is in an activation state, the second multiplex pulse generator 210 can be configured to receive and shift the first pulse signal (P1) by four clock periods more than the test information data (TD). Hence, the fifth to eighth pulse signals (P5) to (P8) generated by the second multiplex pulse generator 210 can mean a consecutive lower 4-bit signal of the test information data (TD). Here, the consecutive lower 4-bit signal of the test information data (TD) can be a specific test mode selection signal.

Accordingly, the second multiplex pulse generator 210 can be configured to generate a specific test mode selection signal while the test mode maintenance signal (LHIT1) is maintained in an activation state. (P5) first subjected to pulsing is referred to as a fifth pulse signal, and P6, P7 and (P8) are sequentially referred to as sixth, seventh and eighth pulse signals in accordance with a generation order of the pulse signals. The description overlapping with the operational principle of the first multiplex generator 110 in the operational description of the second multiplex pulse generator 210 will be omitted. However, since the second multiplex pulse generator 210 can receive the consecutive lower 4-bit signal of the test information data (TD), i.e., "LHHHLHLH", the pulse signals (P5) to (P8) can be provided as "LHLH".

Meanwhile, the activation of the second multiplex pulse generator 210 can be controlled and reset by the power-up signal (PWON) described above. Hence, if the power-up signal (PWON) is activated, the test information data of the first and second multiplex pulse generators 110 and 210 can be reset as well as the test mode maintenance signal (LHIT1).

Figure 6B:
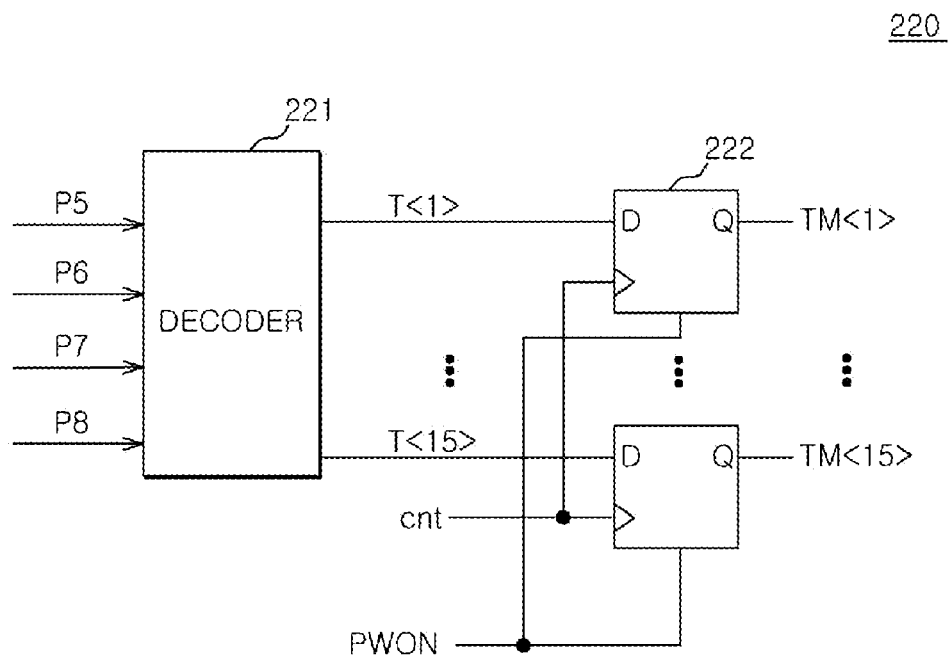
FIG. 6B is a circuit diagram of a second pulse combiner that can be included in the generator illustrated in FIG. 5.

FIG. 6B is a diagram illustrating the second pulse combiner 220 in more detail. Referring to FIG. 6B, the second pulse combiner 220 can be configured to include a decoder 221 and D flip flops 222.

More specifically, the decoder 221 can be configured to receive and decode the pulse signals (P5) to (P8) to provide decoded test mode signals T<1:15>.

For example, if the pulse signals (P5) to (P8) are "LHLH", a specific test mode signal decoded and activated by the decoder 221 may be T<5>. Each of the plurality of D flip flops 222 configured to receive a plurality of decoded signals can be configured to have a clock terminal for receiving the counter pulse (CNT), a terminal D for receiving each decoded test mode signal T<1:15> and a reset terminal for commonly receiving the power-up signal (PWON). Here, the counter pulse (CNT) can be a clock pulse signal activated when the decoder 221 receives and decodes, for example, a lower 4-bit signal of the test mode data (TD). The counter pulse (CNT) will be described later.

Accordingly, the D flip flop 222 can provide the test mode signal (T<5>) triggered and decoded by the counter pulse (CNT) as a test mode selection signal (TM<5>) through an output Q. The specific test mode selection signal (TM<5>) can be a predetermined fifth test mode. The second pulse combiner 220 can continuously maintain the activated specific test mode selection signal (TM<5>) to be in an activation state until the power-up signal (PWON) is activated. However, if the power-up signal (PWON) is activated, the second pulse combiner 220 can reset the test mode selection signal (TM<5>) to be in a non-activation state.

Figure 6C:
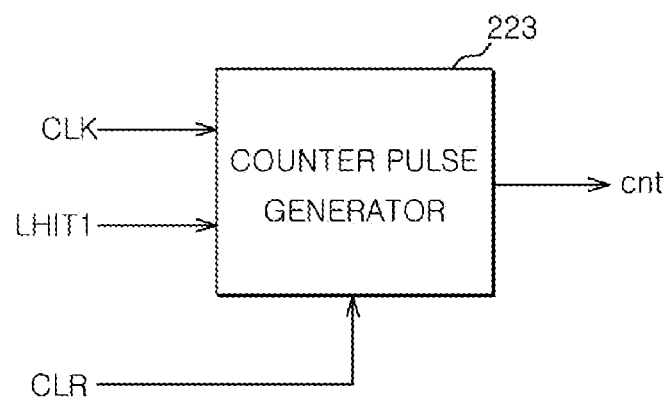
FIG. 6C is a schematic block diagram of a counter pulse generator that can be included in the generator illustrated in FIG. 5.

FIG. 6C is a schematic block diagram illustrating the counter pulse generator 223 in more detail. Referring to FIG. 6C, the counter pulse generator 223 can be configured to receive the clock signal (CLK) and the test mode maintenance signal (LHIT1) to generate the counter pulse (CNT). The counter pulse generator 223 can be controlled by the clear signal (CLR).

More specifically, the counter pulse generator 223 can be configured to count in synchronization with the clock signal (CLK) during an interval at which the test mode maintenance signal (LHIT1) is activated. Then, if the number of predetermined clock periods is satisfied, the counter pulse generator 223 can generate the counter pulse (CNT). Here, the number of predetermined clock periods can be the minimum number of clock periods with which the test information data (TD) is recognized. For example, the number of predetermined clock periods can be the number of clock periods obtained by adding four clock periods required in the pulse signals (P1) to (P4) that are the test mode entry data, four clock periods required in the pulse signals (P5) to (P8) that are the test mode data, and one clock period that becomes a reference for outputting the pulse signals (P5) to (P8) as a specific test mode signal (TM<1:15>) after decoding the pulse signals (P5) to (P8). Hence, the counter pulse generator 223 can include a counter (not shown). Such a counter can use a D flip flop. Such a D flip flop can be reset and controlled by the reset signal (CLR).

In other words, the counter pulse (CNT) can be a clock pulse that defines a minimum interval at which valid test information data (TD) is recognized and becomes an output reference of the test mode selection signal (TM<1:15>).

Figure 7:
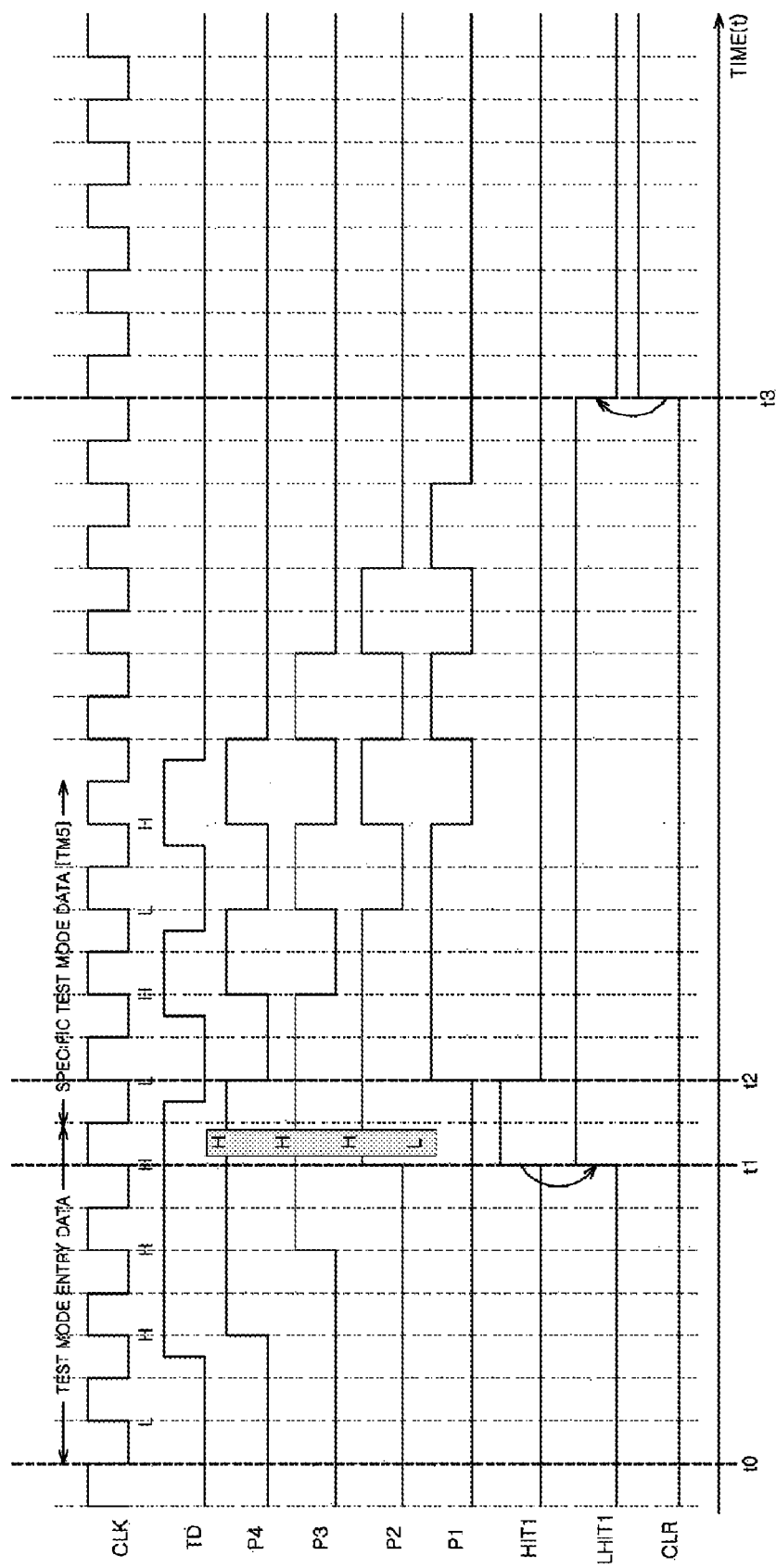
FIG. 7 is a timing diagram illustrating a relation between a reset signal and a test mode maintenance signal according to one embodiment.

FIG. 7 is a timing diagram illustrating a relation between a reset signal (CLR) and a test mode maintenance signal (LHIT1) according to one embodiment. This will be described with reference to FIGS. 1 to 7. In another embodiment, the test information data (TD) can be represented as 1-byte serial data. The upper 4 bits of the test information data (TD) applied to an NC pin (not shown) are "LHHH", and the lower 4 bits of the test information data (TD) are "LHLH".

First, at an interval t0 to t1, the first multiplex pulse generator 110 can be triggered at a rising edge of the clock signal (CLK) to sequentially transmit the test information data (TD), thereby generating the four pulse signals (P1) to (P4).

At an interval t1 to t2, if the pulse signals (P1) to (P4) generated by the four D flip flops 111 to 114 are the predetermined test mode entry data LHHH, the first pulse combiner 120 can be configured to generate the test mode detection signal (HIT1) that is a pulse signal. The D flip flop 124 can be configured to trigger at a rising edge of the test mode detection signal (HIT1) to generate the test mode maintenance signal (LHIT1).

At an interval t2 to t3, the D flip flop 124 of the first pulse combiner 120 can be configured to continuously latch the test mode maintenance signal (LHIT1) to be in a high level. The D flip flop 124 can provide the power level VDD of a data terminal, triggered at a rising edge of the test mode detection signal (HIT1), as the output Q (LHIT1). The test mode maintenance signal (LHIT1) can be latched to be in a high level, that is an activation state, up to a rising edge of the next test mode detection signal (HIT1). Hence, the D flip flop 124 of the first pulse combiner 120 can be configured to latch the value of the previous output Q until the reset signal (CLR) received at the reset terminal of the D flip flop 124 is activated. In other words, the test mode maintenance signal (LHIT1) can maintain the activation state until the reset signal (CLR) is activated and reset.

Then, if the reset signal (CLR) is activated after an interval t3, the D flip flop 124 can be triggered at a rising edge of the reset signal (CLR), and the test mode maintenance signal (LHIT1) can be reset to be in a low level that is a non-activation state. That is, the D flip flop 124 can be controlled by the activated reset signal (CLR) of the reset terminal prior to the clock signal (CLK) of the clock terminal.

As described above, the reset signal (CLR) can be configured to maintain the activation state that is a high level until the test mode activation signal (TMEN) or the power-up signal (PWON) is activated. However, the test mode activation signal (TMEN) can be configured to be generated only when the test mode maintenance signal (LHIT1) is activated. Hence, the state of the reset signal (CLR) can be changed from a high level to a low level when power is up.

That is, in the test circuit according to the one embodiment, if at least one test mode signal (TM<1:15>) is activated, the reset signal (CLR) can be generated to reset the test mode maintenance signal (LHIT1) of the test circuit after a predetermined time. The reset signal (CLR) can continuously maintain an activation state until the power-up signal is activated. Hence, the reset signal (CLR) maintaining the activation state can continuously maintain the test mode maintenance signal (LHIT1) to be in a reset state, i.e., a non-activation state. Accordingly, although new test information data can be applied through the NC pin while the test mode maintenance signal (LHIT1) is maintained to be in the non-activation state that is a low level, the test circuit cannot recognize the new test information data. Therefore, although various test modes exist, in one embodiment, the test circuit can perform only one test mode selected from the first test information data.

In another embodiment, there can be a test circuit provided for recognizing and performing various test modes. The test circuit can recognize various test modes by preventing a test mode maintenance signal from being continuously maintained to be in a non-activation state. Then, the test mode can include a pulse generator for generating a reset signal for controlling the activation of the test mode maintenance signal to have a pulse shape. The test mode maintenance signal can be configured to be controlled by a reset pulse using a simple pulse generating method, so that the test circuit can recognize and perform various test modes, thereby diversifying a failure analysis. The test circuit described above will be described in detail.

Figure 8:
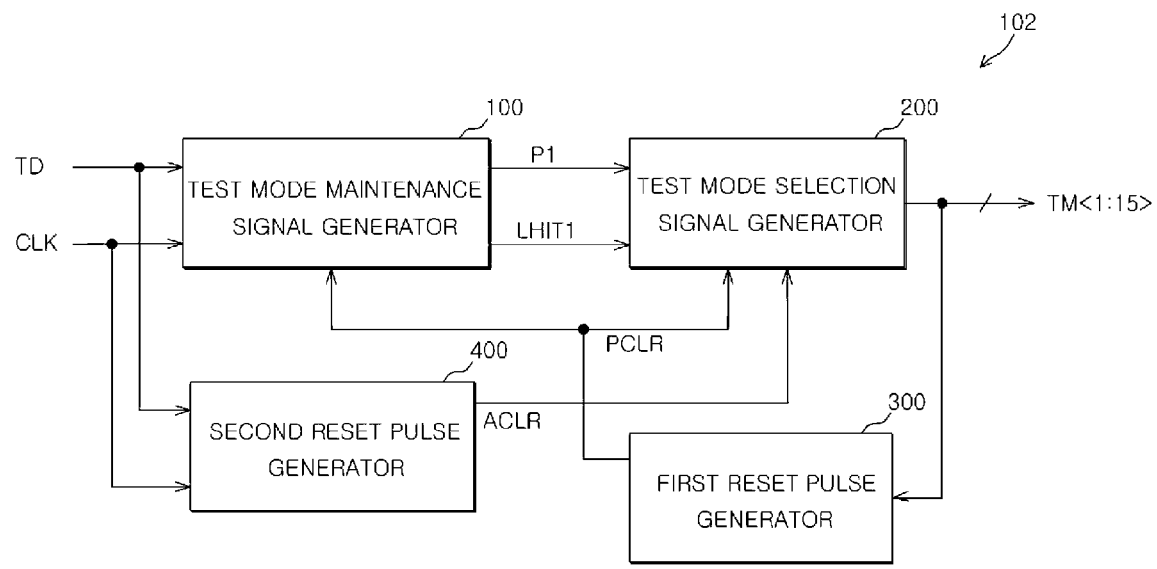
FIG. 8 is a block diagram of a test circuit according to another embodiment.

FIG. 8 is a block diagram illustrating an example test circuit 102 according to another embodiment. Referring to FIG. 8, the test circuit 102 include a test mode maintenance signal generator 100, a test mode selection signal generator 200, a first reset pulse generator 300 and a second reset pulse generator 400.

The test mode maintenance signal generator 100 can be configured to receive a test information data (TD) and a clock signal (CLK) to provide a test mode maintenance signal (LHIT1) for recognizing the test information data (TD), and the activation of the test mode maintenance signal (LHIT1) is controlled by a first reset pulse (PCLR). Specifically, if the test information data (TD) received by the test mode maintenance signal generator 100 is a predetermined test mode entry data, the test mode maintenance signal generator 100 can provide an activated test mode maintenance signal (LHIT1). Then, the test information data (TD) can be recognized during an interval at which the test mode maintenance signal (LHIT1) is activated. The test mode maintenance signal (LHIT1) can be triggered and reset at a rising edge of the first reset pulse (PCLR). Here, the predetermined test mode entry data may be an arbitrary 4-bit data. However, the embodiments described herein are not necessarily limited thereto. The test information data (TD) received by the test mode maintenance signal generator 100 may be triggered and reset at a rising edge of the first reset pulse (PCLR).

The test mode selection signal generator 200 can be configured to receive a shifted test information data (P1) provided from the test mode maintenance signal generator 100 and the test mode maintenance signal (LHIT1). Then, the test mode selection signal generator 200 can generate a specific test mode selection signal (TM<2:15>), and the activation of the specific test mode selection signal (TM<2:15>) can be controlled by a second reset pulse (ACLR). That is, a specific test mode signal can be selected from various test mode selection signals (TM<2:15>) by using the shifted test information data (P1) during an interval at which the test mode maintenance signal (LHIT1) is activated. The test mode selection signal (TM<2:15>) can be triggered and reset at a rising edge of the second reset pulse (ACLR).

If at least one test mode signal (TM<2:15>) is activated, the first reset pulse generator 300 can be configured to generate the first reset pulse (PCLR). The first reset pulse (PCLR) can be a pulse signal and resets the test information data (TD) and the test mode maintenance signal (LHIT1) during an activation interval having a predetermined pulse width.

Meanwhile, the second reset pulse generator 400 can be configured to receive the test information data (TD) and the clock signal (CLK) such as the test mode maintenance signal generator 100. Then, if the test information data (TD) is received as a predetermined test mode reset data, the second reset pulse generator 400 can be configured to generate the second reset pulse (ACLR).

Figure 9:
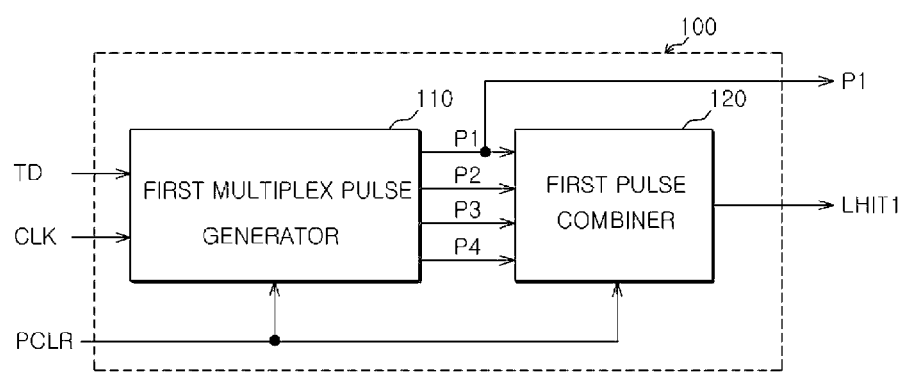
FIG. 9 is a block diagram of a test mode maintenance signal generator that can be included in the circuit illustrated in FIG. 8.

FIG. 9 is a block diagram illustrating the test mode maintenance signal generator 100 in more detail. Referring to FIG. 9, the test mode maintenance signal generator 100 can include a first multiplex pulse generator 110 and a first pulse combiner 120.

The first multiplex pulse generator 110 can be configured to receive the test information data (TD) and the clock signal (CLK) to generate pulse signals (P1) to (P4). The first multiplex pulse generator 110 is controlled by a first reset pulse (PCLR). The first multiplex pulse generator 110 may include a shift register for generating the pulse signals (P1) to (P4).

The first pulse combiner 120 may combines the pulse signals (P1) to (P4) to provide the test mode maintenance signal (LHIT1). The first pulse combiner 120 can also controlled by the first reset pulse (PCLR). That is, if the pulse signals (P1) to (P4), received by the first pulse combiner 120, are predetermined test mode entry data, the first pulse combiner 120 can provide the test mode maintenance signal (LHIT1) in response to the predetermined test mode entry data. The first pulse combiner 120 can include a combining circuit for receiving the pulse signals (P1) to (P4).

Figure 10A:
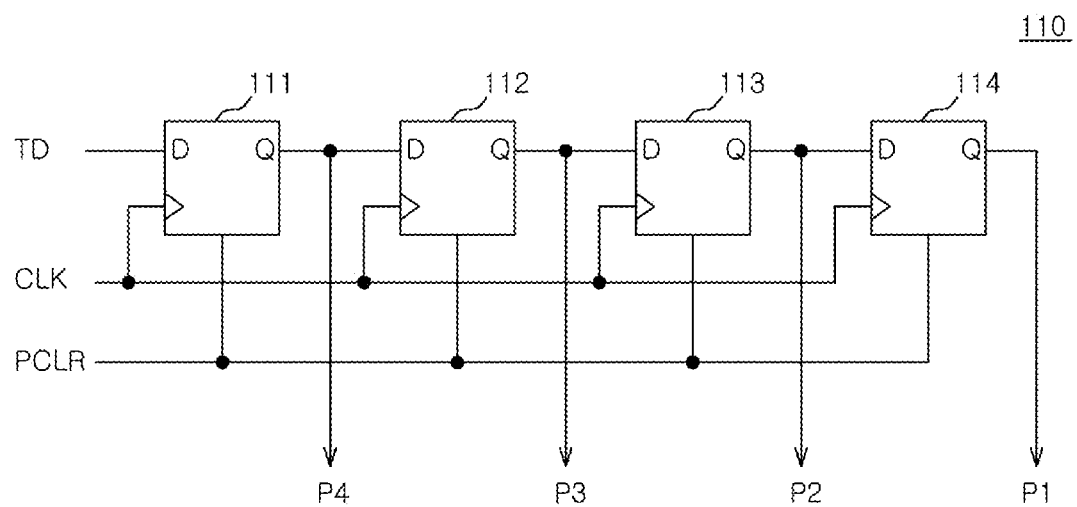
FIG. 10A is a circuit diagram of a first multiplex pulse generator that can be included in the generator illustrated in FIG. 9.

FIG. 10A is a circuit diagram illustrating the first multiplex pulse generator 110 in more detail. Referring to FIG. 10A, the first multiplex pulse generator 110 can be configured to store the received test information data (TD) and sequentially shift the stored test information data (TD) in synchronization with the clock signal (CLK) to generate the pulse signals (P1) to (P4). In order to generate the four pulse signals, the first multiplex pulse generator 110 can include four shift registers which are connected in series. D flip flops can be used as the shift registers. However, the present embodiment is not necessarily limited thereto. At this time, each of the D flip flops 111 to 114 has a clock terminal for receiving the clock signal (CLK), a terminal D for receiving the test information data (TD), and a reset terminal for receiving the first reset pulse (PCLR). Then, the pulse signals (P1) to (P4) can be generated at respective output terminals Q of the four D flip flops 111 to 114, respectively.

In another embodiment, the test information data (TD) can be illustrated as a 1-byte serial data. The first multiplex pulse generator 110 can be configured to include the four D flip flops 111 to 114, so the test information data (TD) transmitted for four clock periods has consecutive four bits. For convenience in illustration, (P1) first subjected to pulsing is referred to as a first pulse signal, and (P2), P3 and (P4) are sequentially referred to as second, third and fourth pulse signals in accordance with a generation order of the pulse signals.

In another embodiment, the D flip flop is illustrated as a D flip flop for transmitting data by triggering the data at a rising edge of a clock. However, the embodiments described herein are not necessarily limited thereto. For example, a serial test information data can be received by the first D flip flop 111 as "LHHHLHLH". The first D flip flop 111 can be configured to trigger at a rising edge of the clock signal (CLK), and thus a data received at the terminal D is sequentially transmitted to the next D flip flop 112. Hence, the test information data (TD) can be triggered at every rising edge of the clock signal (CLK) can be sequentially transmitted. Meanwhile, the pulse signals (P1) to (P4) provided from the first multiplex pulse generator 110 can be triggered and reset at a rising edge of the first reset pulse (PCLR).

Figure 10B:
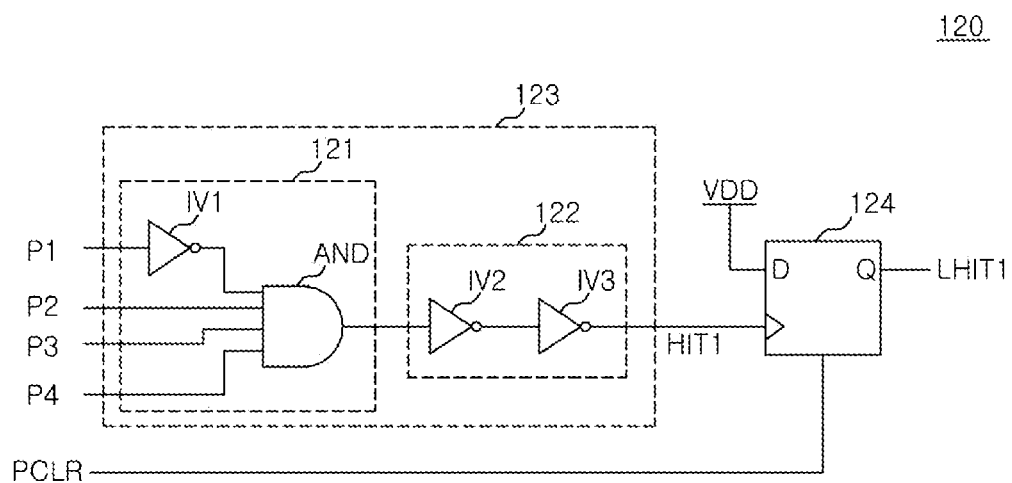
FIG. 10B is a circuit diagram of a first pulse combiner that can be included in the generator illustrated in FIG. 9.

FIG. 10B is a circuit diagram illustrating the first pulse combiner 120 in more detail. Referring to FIG. 10B, the first pulse combiner 120 can be configured to include a combiner 123 and a D flip flop. The combiner 123 can parallelize the serial pulse signals (P1) to (P4) to generate the test mode maintenance signal (LHIT1). More specifically, the combiner 123 can be configured to receive the pulse signals (P1) to (P4), and if the received pulse signals (P1) to (P4) are predetermined test mode entry data, the combiner 123 provides a test mode detection signal (HIT1). The combiner 123 can be configured to include a receiver 121 and a delay unit 122.

First, the receiver 121 can be configured to include a first inverter IV1 and an AND gate AND. The receiver 121 can be configured to receive the inversion signal of the first pulse signal (P1) and second to fourth pulse signals (P2) to (P4). When all the received signals are in a high level, i.e., predetermined test mode entry data LHHH, the receiver 121 can be configured to provide a high-level signal through an AND operation of the AND gate AND. Hence, the receiver 121 can provide a high-level signal having an activation interval only when the pulse signals (P1) to (P4) are received as "LHHH". If the signal passes through the delay unit 122, the test mode detection signal (HIT1) can be generated. Although the delay unit 122 includes two inverters IV2 and IV3, the number of inverters may be increased or decreased so as to adjust a delay time.

The D flip flop 124 can be configured to have a clock terminal for receiving the test mode detection signal (HIT1), a terminal D for receiving a supply power voltage (hereinafter, referred to as VDD), and a reset terminal for receiving the first reset pulse (PCLR). Then, the D flip flop 124 can be configured to trigger at a rising edge of the test mode detection signal (HIT1) to output the power level VDD to an output terminal Q. In other words, if the pulse signals (P1) to (P4) are predetermined test entry mode data LHHH, the test mode detection signal (HIT1) may be generated. The D flip flop 124 can be configured to trigger at a rising edge of the test mode detection signal (HIT1) such that the test mode maintenance signal (LHIT1) can be continuously maintained as a high-level signal. Meanwhile, the D flip flop 124 can be controlled by the first reset pulse (PCLR). Hence, the test mode maintenance signal (LHIT1) can be maintained as a high-level signal that is in an activation state until the first reset pulse (PCLR) is activated. As described above, the test circuit can recognize the test information data (TD) during an interval at which the test mode maintenance signal (LHIT1) is activated and perform a test process.

Figure 11:
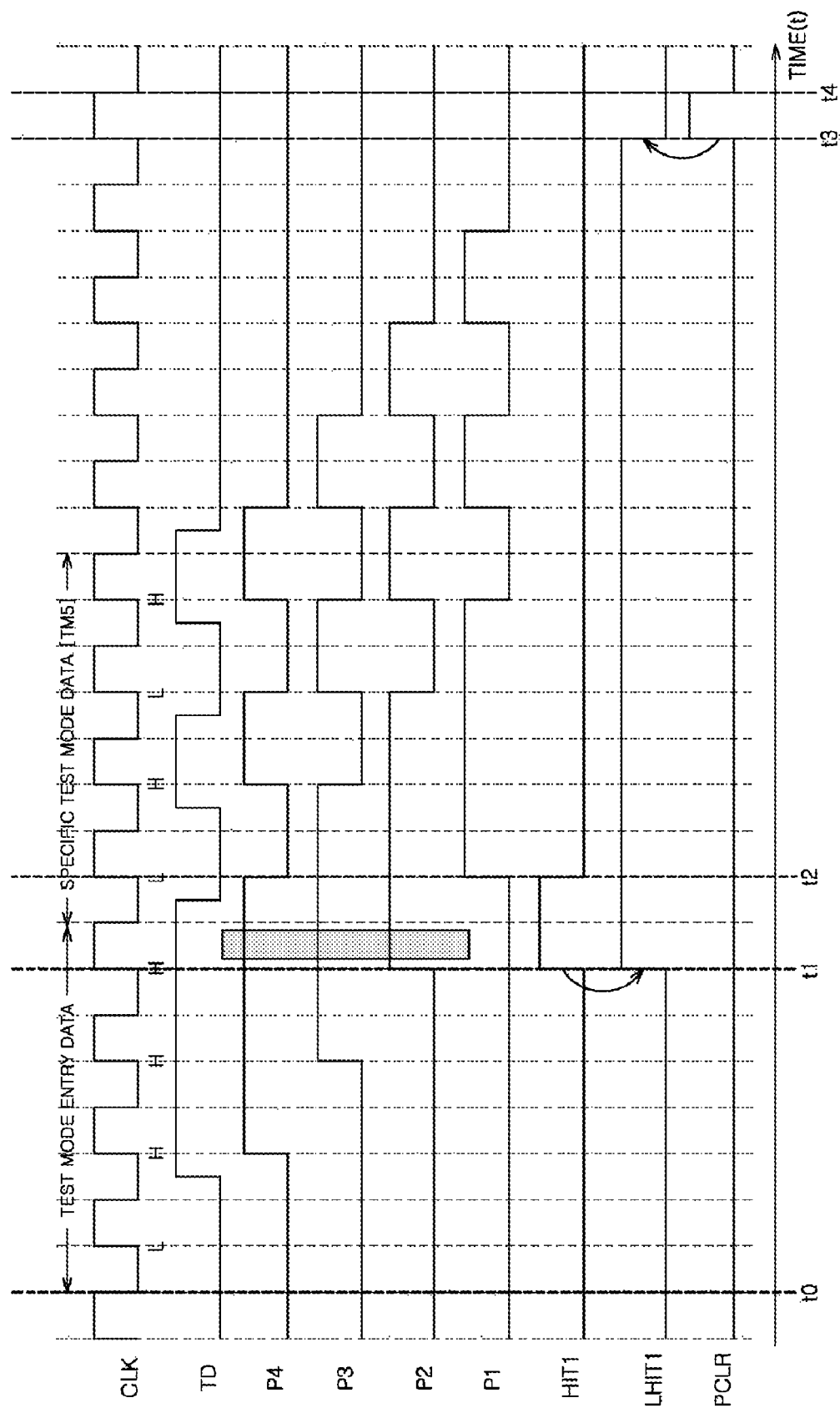
FIG. 11 is a timing diagram illustrating the operation of the test mode maintenance signal circuit illustrated in FIG. 8.

FIG. 11 is a timing diagram illustrating the operation of the test mode maintenance signal generator 100. The operation of the test mode maintenance generator 100 will be described with reference to FIGS. 8 to 11. In another embodiment, the test information data (TD) is illustrated as a 1-byte serial data. The upper 4 bits of the test information data (TD) applied to an NC pin (not shown) are "LHHH", and the lower 4 bits of the test information data (TD) a re "LHLH".

First, at an interval t0 to t1, the first multiplex pulse generator 110 can be configured to trigger at a rising edge of the clock signal (CLK) to sequentially transmit the test information data (TD), thereby generating the four pulse signals (P1) to (P4).

At an interval t1 to t2, if the pulse signal (P1) to (P4) generated by the four D flip flops 111 to 114 are the predetermined test mode entry data LHHH, the first pulse combiner 120 can be configured to generate the test mode detection signal (HIT1) that is a pulse signal. The D flip flop 124 can be configured to trigger at a rising edge of the test mode detection signal (HIT1) to generate the test mode maintenance signal (LHIT1).

At an interval t2 to t3, the D flip flop 124 of the first pulse combiner 120 can be configured to continuously latch the test mode maintenance signal (LHIT1) to be in a high level. The D flip flop 124 can be configured to provide the power level (VDD) of a data terminal, triggered at a rising edge of the test mode detection signal (HIT1), as the output Q (LHIT1). The test mode maintenance signal (LHIT1) can be latched to be in a high level that is an activation state up to a rising edge of the next test mode detection signal (HIT1). Hence, the D flip flop 124 of the first pulse combiner 120 can latch the value of the previous output Q until the first reset pulse (PCLR) received at the reset terminal of the D flip flop 124 is activated. In other words, the test mode maintenance signal (LHIT1) can maintain the activation state until the first reset pulse (PCLR) is activated and reset.

If the first rest pulse signal is activated as described at the interval t3 to t4, the D flip flop 124 can be configured to trigger at a rising edge of the first reset pulse (PCLR), and the test mode maintenance signal (LHIT1) can be reset to be in the low level that is a non-activation state. That is, the D flip flop 124 can be controlled by the activated first reset pulse (PCLR) of the reset terminal prior to the clock signal (CLK) of the clock terminal. As described above, the reset signal (CLR), according to one embodiment, was a signal continuously maintained to be in a high level that is an activation state.

According to another embodiment, the first reset pulse (PCLR) is a pulse signal, in which a high-level activation interval has a predetermined pulse width. Hence, the interval for maintaining the activation state of the first reset pulse (PCLR), that is a signal of the reset terminal, can be generated to be short. The first reset pulse (PCLR) is a pulse signal which can control a current test mode to be reset during high-level of pulse. Accordingly, the test mode maintenance signal (LHIT1) can be triggered and activated by a new test mode detection signal (HIT1) reset by the first reset pulse (PCLR) to be in a non-activation state and then received again at the clock terminal of the D flip flop 124. Then, the first reset pulse (PCLR') may be a signal to recognize another test mode newly. Thus, the test circuit can be configured to generate the test mode maintenance signal (LHIT1) that is in an activation state, thereby recognizing another test mode data (TD). In other words, the test circuit can be configured to recognize and operate for test mode of different types after the first power-up signal (PWON) is applied.

Figure 12:
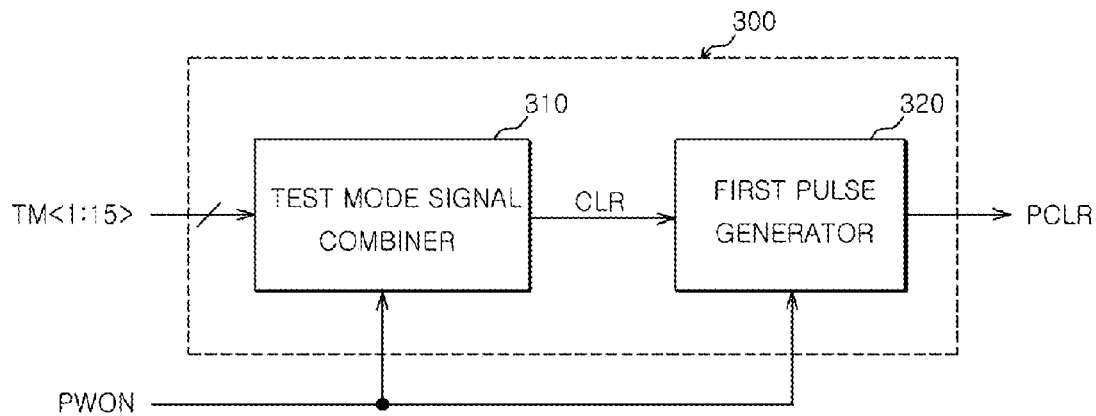
FIG. 12 is a block diagram of a first reset signal generator that can be included in the circuit illustrated in FIG. 8.

FIG. 12 is a block diagram illustrating the first reset signal generator 300 in more detail. Referring to FIG. 12, the first reset pulse generator 300 can be configured to include a test mode signal combiner 310 and the first pulse generator 320. The first reset pulse generator 300 can be configured to receive all the test mode selection signals (TM<2:15>) and generates the first reset signal (PCLR) in response to a combined signal.

More specifically, the test mode signal combiner 310 can be configured to receive and combine all the test mode selection signals (TM<2:15>). Here, the test mode selection signals (TM<2:15>) can be generated by the combination of 4-bit signals, and $2^4$ test modes can be generated. However, the test mode selection signals (TM<2:15>) can be obtained by combining other possible data except the predetermined test mode entry data described above and a predetermined test mode reset data which will be described later.

Continuously, the test mode signal combiner 310 will be described. If at least one test mode selection signal (TM<2:15>) is activated, the test mode signal combiner 310 provides an activated clear signal (CLR). The first pulse generator 320 can be configured to provide the first reset pulse (PCLR) for resetting the test mode maintenance signal generator (100 of FIG. 1) in response to the activated clear signal (CLR).

Figure 13A:
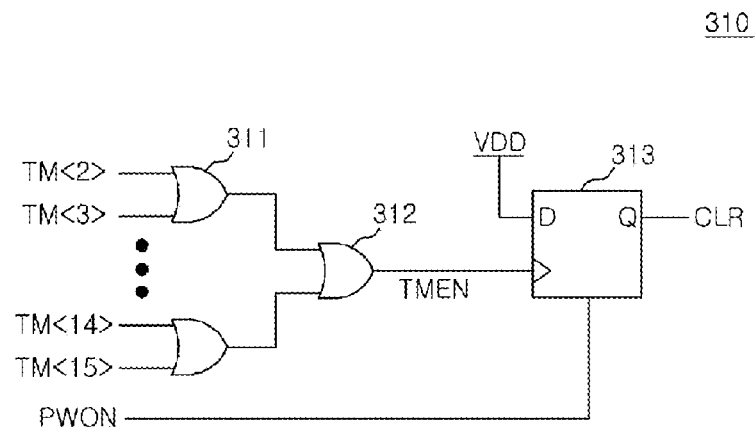
FIG. 13A is a circuit diagram of a test mode signal combiner that can be included in the generator illustrated in FIG. 12.

FIG. 13A is a circuit diagram illustrating the test mode signal combiner 310 in more detail. Referring to FIG. 13A, the test mode signal combiner 310 can be configured to include a plurality of OR gates 311 and 312 and a D flip flop 313. The test mode signal combiner 310 can include the OR gates 311 and 312 for receiving and combining all the test mode signals (TM<2:15>). If at least one test mode selection signal (TM<2:15>) from the test mode signals (TM<2:15>) received by the OR gates 311 and 312 is activated, an activated test mode activation signal (TMEN) can be provided. In other words, the activated test mode activation signal (TMEN) can mean that at least one test mode is selected. The D flip flops can be configured to have a clock terminal for receiving the test mode activation signal (TMEN), a terminal D for receiving the power level VDD and a reset terminal for receiving a power-up signal (PWON). The power-up signal (PWON) can be a pulse signal which is activated when power is up.

Accordingly, the test mode signal combiner 255 can output a high-level clear signal (CLR) triggered and activated at a rising edge of the at least one activated test mode selection signal (TM<2:15>). The D flip flop 313 can be configured to latch the clear signal (CLR) of an activated high level until a rising edge of the next test mode activation signal (TMEN) is inputted into the D flip flop 313. Further, the D flip flop 313 can be configured to latch the clear signal (CLR) of a high level before the power-up signal (PWON) is activated.

Figure 13B:
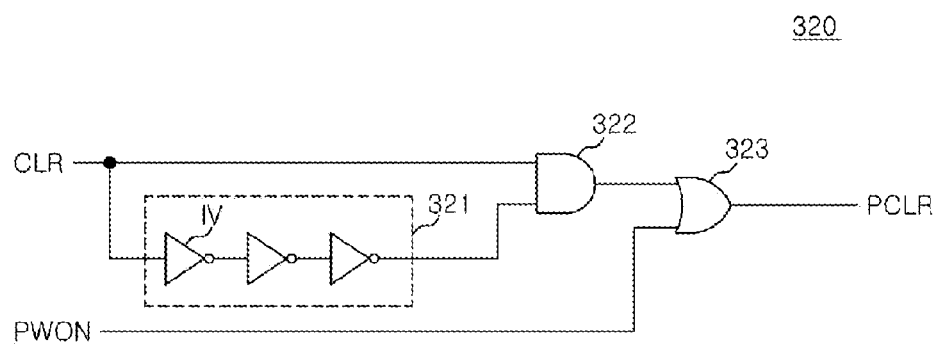
FIG. 13B is a circuit diagram of a first reset pulse generator that can be included in the generator illustrated in FIG. 12.

FIG. 13B is a circuit diagram illustrating the reset pulse generator 320 in more detail. Referring to FIG. 13B, the first pulse generator 320 can be configured to generate the first reset pulse (PCLR) using the clear signal (CLR).

The first pulse generator 320 can be configured to include a delay unit 321 having a plurality of inverters IV, an AND gate 322 and an OR gate 323. The first pulse generator 320 can be configured to combine the clear signal (CLR) and a signal inversely delayed by the delay unit 321 to generate a pulse signal. The OR gate 323 can combine the pulse signal and the power-up signal (PWON) to generate the first reset pulse (PCLR). Hence, the first reset pulse (PCLR) can be activated when power is up, or the pulse-shaped first reset pulse (PCLR) can be generated when at least one test mode selection signal (TM<2:15>) is activated. Accordingly, if the at least one test mode selection signal (TM<2:15>) is activated, the first reset pulse (PCLR) resets the test mode maintenance signal generator (100 of FIG. 8) to be ready for receiving a new test mode data (TD).

Figure 14:
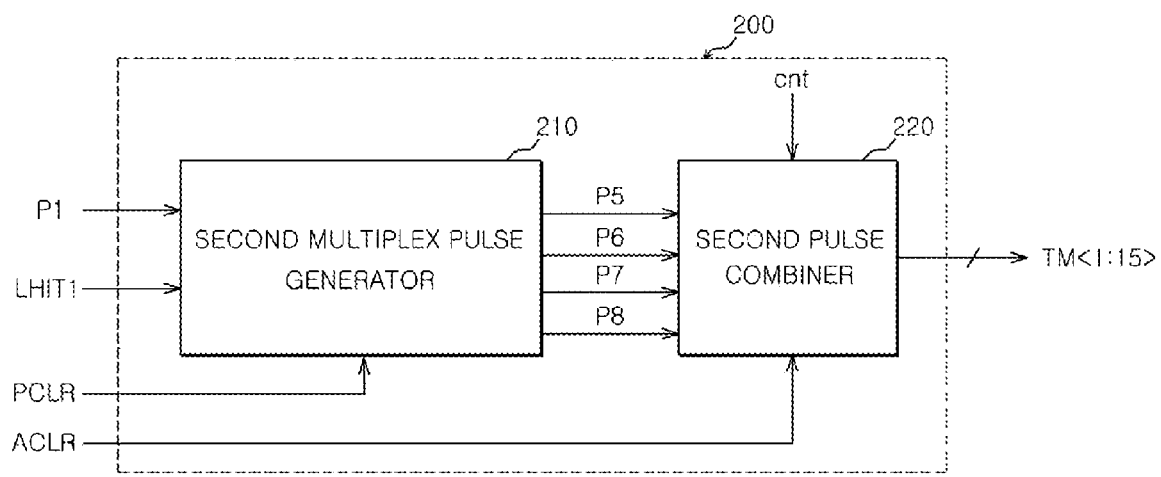
FIG. 14 is a block diagram of a test mode selection signal generator that can be included in the circuit illustrated in FIG. 8.

FIG. 14 is a schematic block diagram illustrating the test mode selection signal generator 200. Referring to FIG. 14, the test mode selection signal generator 200 can be configured to include a second multiplex pulse generator 210 and a second pulse combiner 220.

The second multiplex pulse generator 210 can be configured to receive the first pulse signal (P1) generated by the first multiplex pulse generator (110 of FIG. 9), i.e., the shifted test information data, and the test mode maintenance signal (LHIT1) to generate pulse signals (P5) to (P8). The multiplex pulse generator 210 can be controlled by the first reset pulse (PCLR). As the first multiplex pulse generator 110 described above, the second multiplex pulse generator 210 may also include a shift register for generating the pulse signals (P5) to (P8).

The second pulse combiner 220 can be configured to combine the pulse signals (P5) to (P8) to provide the test mode selection signal (TM<2:15>). The second pulse combiner 220 can be controlled by the second reset pulse (ACLR) and a counter pulse (CNT). That is, one activated test mode selection signal (TM<i>) (i=2 to 5) selected from the test mode selection signals (TM<2:15>) can be provided by the pulse signals (P5) to (P8) received by the second pulse combiner 220. The second pulse combiner 220 can be configured to include a decoder for decoding the pulse signals (P5) to (P8) to generate the test mode selection signal (TM<2:15>).

Figure 15A:
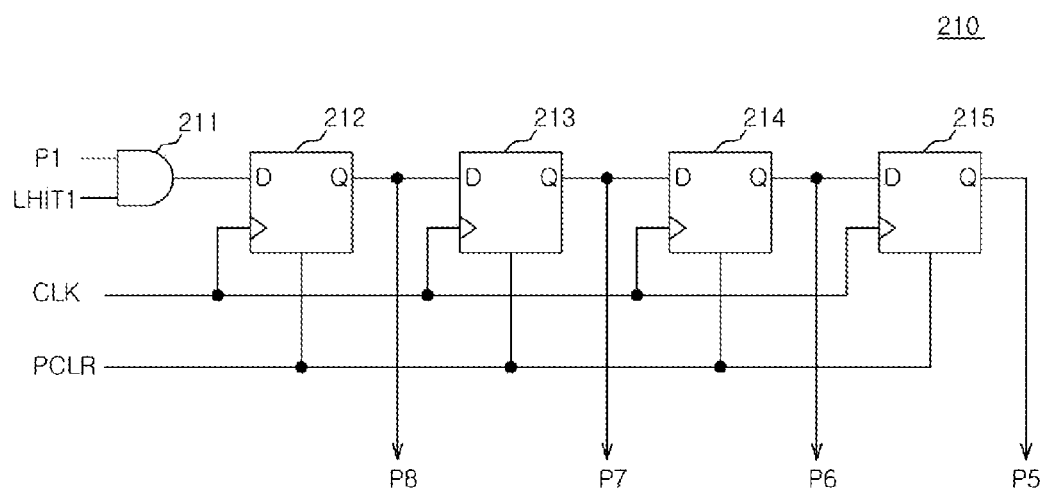
FIG. 15A is a circuit diagram of a second multiplex pulse generator that can be included in the generator illustrated in FIG. 14.
Figure 15B:
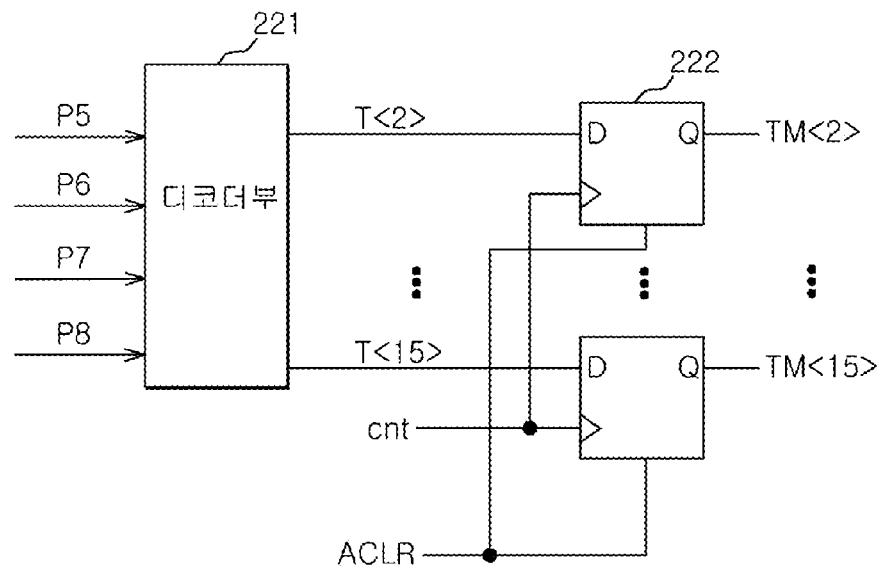
FIG. 15B is a circuit diagram of a second pulse combiner in FIG. 14.
Figure 15C:
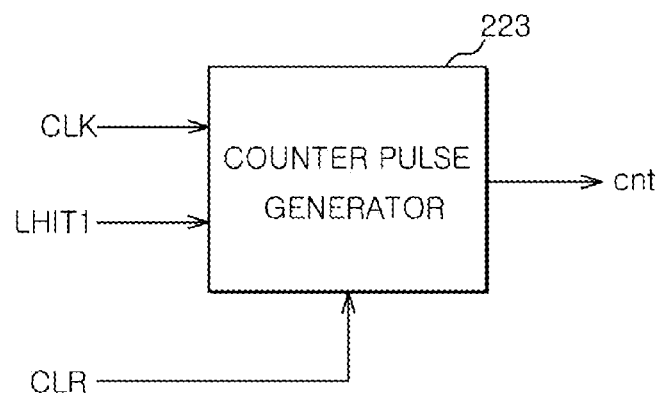
FIG. 15C is a schematic block diagram of a counter pulse generator that can be included in the generator illustrated in FIG. 15B.

FIGS. 15A and 15B are detailed circuit diagrams illustrating the second multiplex pulse generator 210 and the second pulse combiner 220 in FIG. 14. FIG. 15C is a schematic block diagram illustrating the counter pulse generator 223 in FIG. 15B. Referring to FIG. 15A, the second multiplex pulse generator 210 can be configured to include an AND gate 211 and a plurality of D flip flops 212 to 215. The second multiplex pulse generator 210 can be configured to store a signal obtained by combining the first pulse signal (P1) and the test mode maintenance signal (LHIT1) and to sequentially shift the stored signal in synchronization with the clock signal (CLK) to generate the pulse signals (P5) to (P8). Here, the second multiplex pulse generator 210 can be configured to include four D flip flops 212 to 215, which are connected in series so as to generate the pulse signals (P5) to (P8).

While the test mode maintenance signal can be configured to be maintained as a high-level signal that is in an activation state, the second multiplex pulse generator 210 can be configured to receive and shift the first pulse signal (P1) by four clock periods more than the test information data (TD). Hence, the fifth to eighth pulse signals (P5) to (P8) generated by the second multiplex pulse generator 210 can mean a consecutive lower 4-bit signal of the test information data (TD). The consecutive lower 4-bit signal of the test information data (TD) can be a specific test mode selection signal.

Accordingly, the second multiplex pulse generator 210 can generate a specific test mode selection signal while the test mode maintenance signal (LHIT1) is maintained in an activation state. (P5) first subjected to pulsing is referred to as a fifth pulse signal, and P6, P7 and (P8) are sequentially referred to as sixth, seventh and eighth pulse signals in accordance with a generation order of the pulse signals. The description overlapping with the operational principle of the first multiplex generator 110 in the operational description of the second multiplex pulse generator 210 will be omitted. However, since the second multiplex pulse generator 210 can receive the consecutive lower 4-bit signal of the test information data (TD), i.e., "LHHHLHLH", the pulse signals (P5) to (P8) can be provided as "LHLH".

Meanwhile, the activation of the second multiplex pulse generator 210 can be configured to be controlled and reset by the first reset pulse (PCLR) described above. Hence, if the first reset pulse (PCLR) is activated, the test information data of the first and second multiplex pulse generators 110 and 210 can be reset as well as the test mode maintenance signal (LHIT1).

Referring to FIG. 15B, the second pulse combiner 220 can include a decoder 221 and D flip flops 222. More specifically, the decoder 221 can be configured to receive and decode the pulse signals (P5) to (P8) to provide decoded test mode signals T<2:15>.

For example, if the pulse signals (P5) to (P8) are "LHLH", a specific test mode signal can be decoded and activated by the decoder 221 may be (T<5>). Each of the plurality of D flip flops 222 for receiving a plurality of decoded signals can have a clock terminal for receiving the counter pulse (CNT), a terminal D for receiving each decoded test mode signal (T<2:15>) and a reset terminal for commonly receiving the second reset pulse (ACLR). Here, the counter pulse (CNT) can be a clock pulse signal activated when the decoder 221 receives and decodes, for example, a lower 4-bit signal of the test mode data (TD). The counter pulse (CNT) will be described later.

Accordingly, the D flip flop 222 can provide the test mode signal (T<5>) triggered and decoded by the counter pulse (CNT) as a test mode selection signal (TM<5>) that is an output Q. The specific test mode selection signal (TM<5>) can be a predetermined fifth test mode. The second pulse combiner 220 can continuously maintain the activated specific test mode selection signal (TM<5>) to be in an activation state until a second reset pulse (ACLR) is activated. However, if the second reset pulse (ACLR) is activated, the second pulse combiner 220 can reset the test mode selection signal (TM<5>) to be in a non-activation state.

Referring to FIG. 15C, the counter pulse generator 223 can be configured to receive the clock signal (CLK) and the test mode maintenance signal (LHIT1) and to generate the counter pulse (CNT). The counter pulse generator 223 can be controlled by the clear signal (CLR).

More specifically, the counter pulse generator 223 can be configured to count in synchronization with the clock signal (CLK) during an interval at which the test mode maintenance signal (LHIT1) is activated. Then, if the number of predetermined clock periods is satisfied, the counter pulse generator 223 can be configured to generate the counter pulse (CNT). In the embodiment described here, the number of predetermined clock periods can be the minimum number of clock periods with which the test information data (TD) is recognized. For example, the number of predetermined clock periods can be the number of clock periods obtained by adding four clock periods required in the pulse signals (P1) to (P4) that are the test mode entry data, four clock periods required in the pulse signals (P5) to (P8) that are the test mode data, and one clock period that becomes a reference for outputting the pulse signals (P5) to (P8) as a specific test mode signal (TM<2:15>) after decoding the plurality of the pulse signals (P5) to (P8). Hence, the counter pulse generator 223 can include a counter (not shown). Such a counter can use a D flip flop. Such a D flip flop may be reset and controlled by the clear signal ((CLR) of FIG. 13A).

In other words, the counter pulse (CNT) can be a clock pulse that defines a minimum interval at which valid test information data (TD) is recognized and becomes an output reference of the test mode selection signal (TM<2:15>).

As described above, according to another embodiment, the test mode maintenance signal (LHIT1) and the test information data (TD) can be reset by the first reset pulse (PCLR) during a pulse interval, thereby receiving a new test information data (TD). Then, after the first power-up signal PWON is applied, a specific test mode meant by the specific test mode selection signal (TM<i>) (i=2 to 15) can be independently or simultaneously performed as a failure analysis engineer desires. Herein, the test information data (TD) defines a test mode type. At this time, all the specific test mode selection signals (TM<2:15>) can be reset using the second reset pulse (ACLR).

FIG. 16 is a timing diagram illustrating the operation of the test mode selection signal generator 200. The operation of the test mode selection signal generator 200 will be described with reference to FIGS. 14 to 15C.

At interval t0 to t1, the second multiplex pulse generator 210 can be configured to sequentially transmit the first pulse (P1) to generate the pulse signals (P5) to (P8) during an interval at which the test mode maintenance signal (LHIT1) is in a high level.

At interval t1 to t2, the decoder 221 can be configured to decode the pulse signals (P5) to (P8) to generate the decoded test mode signal (T<5>). The D flip flop 222 of the second pulse combiner 220 can provide the decoded test mode signal (T<5>) as the test mode selection signal (TM<5>).

It can be seen that the test mode selection signal (TM<5>) is still activated after the interval t2. The fifth test mode can be performed during a high-level interval at which the test mode selection signal (TM<5>) is activated. Meanwhile, it can be seen that the test mode maintenance signal (LHIT1) can be reset by a first reset pulse (PCLR) (not shown) produced when the test mode selection signal (TM<5>) is activated.

Figure 17:
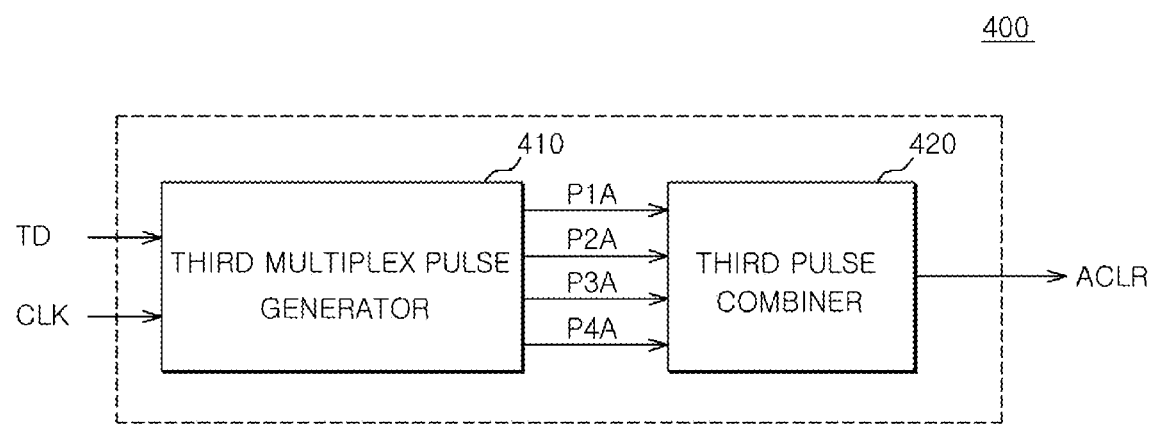
FIG. 17 is a block diagram of a second reset signal generator that can be included in the circuit illustrated in FIG. 8.
Figure 18A:
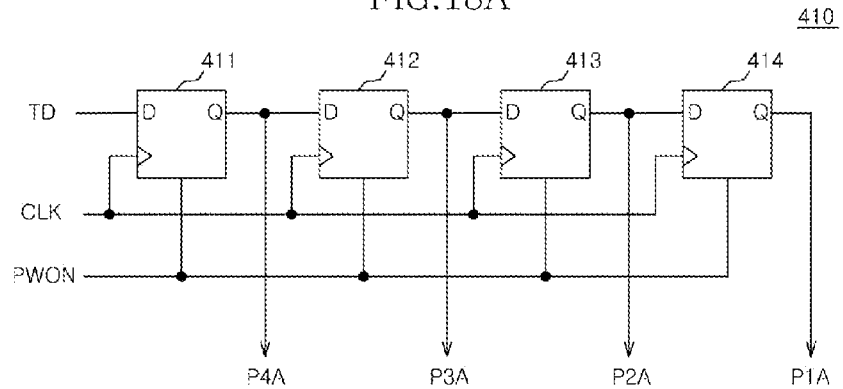
FIG. 18A is a circuit diagram of a third multiplex pulse generator that can be included in the generator illustrated in FIG. 17.
Figure 18B:
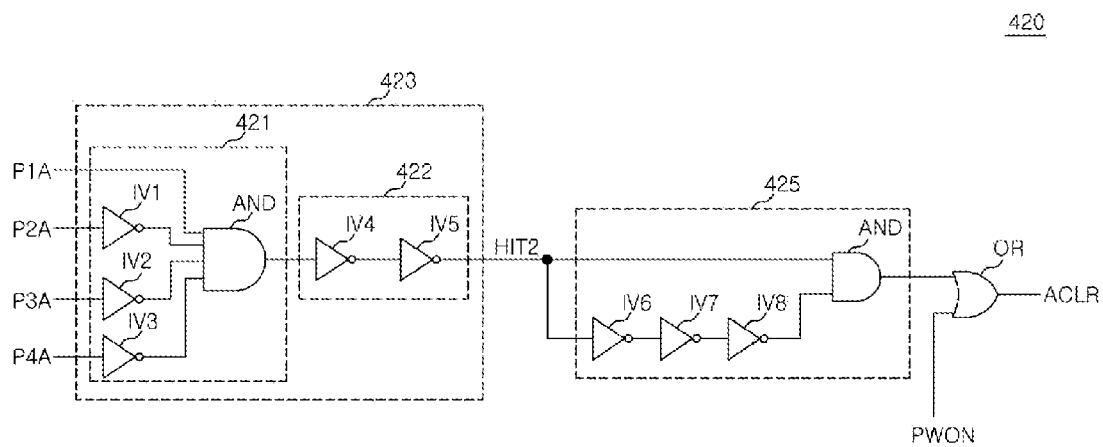
FIG. 18B is a circuit diagram of a third pulse combiner that can be included in the generator illustrated in FIG. 17.

FIG. 17 illustrates a schematic block diagram of the second reset signal generator 400 in more detail. FIGS. 18A and 18B illustrate detailed circuit diagrams of a third multiplex pulse generator 410 and a third pulse combiner 420 of FIG. 17 in more detail.

Referring to FIGS. 17 to 18B, the second reset pulse generator 400 can be configured to include a third multiplex pulse generator 410 and a third pulse combiner 420. The second reset pulse generator 400 can be configured to receive the test information data (TD) to generate pulse signals (P1A) to (P4A). Then, the second reset pulse generator 400 can be configured to combine the plurality of the pulse signals (P1A) to (P4A) to generate the second reset pulse (ACLR) for resetting the test mode selection signal (TM<2:15>).

First, since the third multiplex pulse generator 410 can have a configuration similar to the first multiplex pulse generator (110 of FIG. 10A), the detailed operational principle of the third multiplex pulse generator 410 will be omitted. The third multiplex pulse generator 410 can be configured to store the received test information data (TD) and sequentially shift the stored test information data (TD) in synchronization with the clock signal (CLK) to generate the plurality of the pulse signals (P1A) to (P4A). The third multiplex pulse generator 410 is different from the first multiplex pulse generator (110 of FIG. 10A) in that the power-up signal (PWON) can be received at a reset terminal.

The third pulse combiner 420 can be configured to receive and combine the pulse signals (P1A) to (P4A) to provide the second reset pulse (ACLR). The third pulse combiner 420 can be configured to include a combiner 423 and a second pulse generator 425.

The combiner 423 can be configured to receive the four pulse signals (P1A) to (P4A) to generate an activated reset detection signal HIT2 when the four pulse signals (P1A) to (P4A) are received as a predetermined test mode reset data HLLL. Here, the predetermined test mode reset data HLLL is illustrated as an arbitrary data. However, it will be apparent that the predetermined test mode reset data HLLL may be another data. The combiner 423 can be configured to include a receiver 421 and a delay unit 422. The receiver 421 can be configured to include inverters IV1 to IV3 for respectively receiving inversion levels of the four pulse signals (P1A) to (P4A) and an AND gate AND for combining the inversion levels of the four pulse signals (P1A) to (P4A). If the four pulse signals (P1A) to (P4A) are received as the predetermined test mode reset data HLLL, the receiver 421 can generate a pulse signal having a predetermined pulse width through the AND gate AND. The pulse signal can be provided as the reset detection signal HIT2 through the delay unit 422.

The second pulse generator 425 can be configured to be a typical pulse generating circuit. The second pulse generator 425 can be configured to include a plurality of inverters IV6 to IV8 and an AND gate AND. The second reset pulse (ACLR) may be directly generated using the reset detection signal HIT2 received by the second pulse generator 425. However, the third pulse combiner 420 can be configured to further include an OR gate OR for combining the pulse signal provided by the second pulse generator 425 and the power-up signal (PWON) to generate the second reset pulse (ACLR) in accordance with the OR gating operation of the pulse signal and the power-up signal (PWON). The reset pulse (ACLR) can be generated by adding a possible pulse generated when the test mode selection signal (TM<2:15>) is reset (e.g., when power is up).

Figure 19:
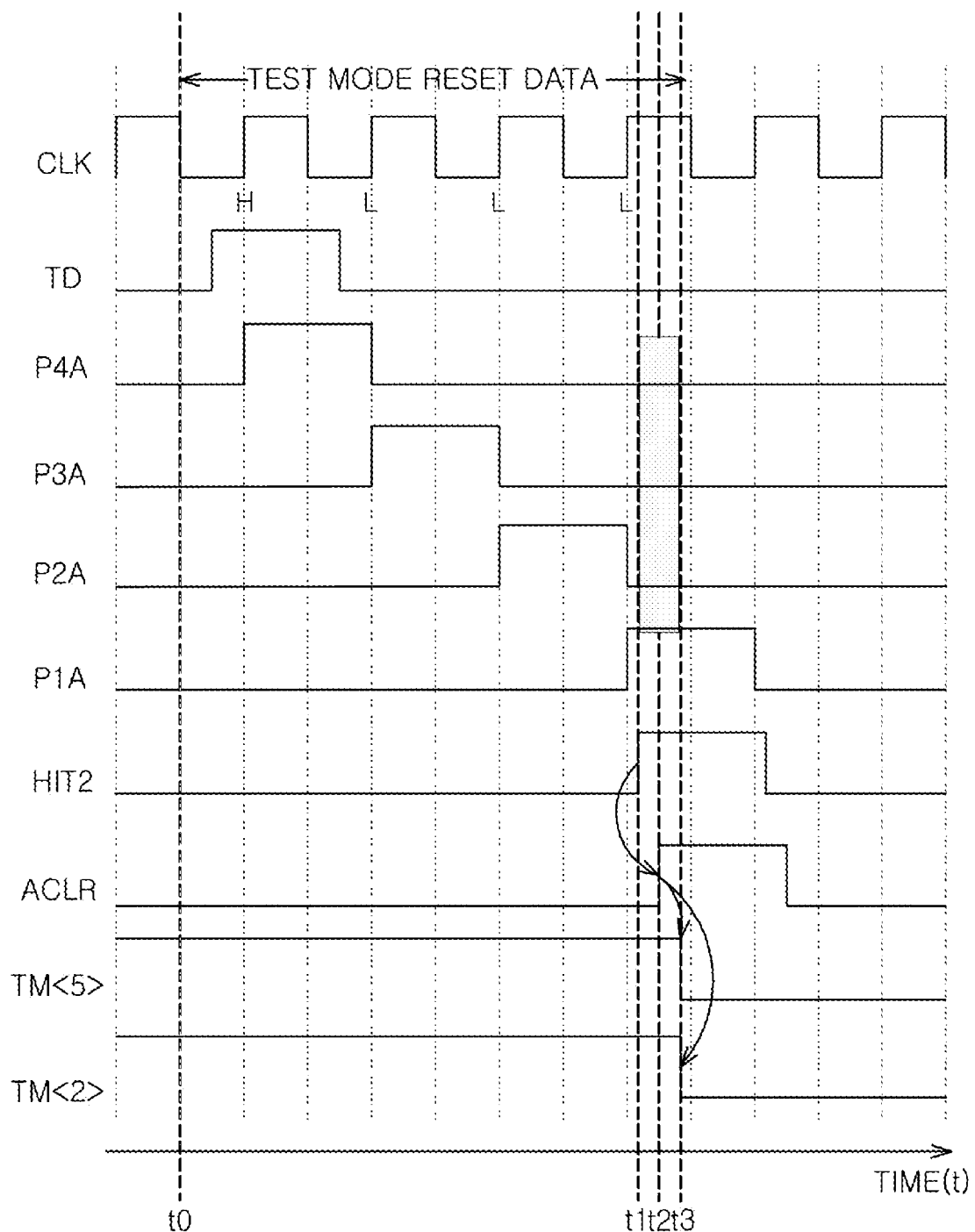
FIG. 19 is a timing diagram illustrating the control operation of a second reset pulse.

The operation of controlling the test mode selection signal (TM<2:15>) with the second reset pulse (ACLR) will be described with reference to FIG. 19.

At interval t0 to t1, a case where upper 4 bits of the test information data (TD) can be received as the predetermined test mode reset data HLLL will be described. Hence, the test information data (TD), i.e., "HLLL", serialized during four clock periods is applied through the NC pin. The test information data (TD) can be configured to be simultaneously received by the first or third multiplex pulse generator (110 of FIG. 10A or 410 of FIG. 17). At this time, if the received test information data (TD) can be configured to be the predetermined test mode entry information LHHH or the predetermined test mode reset data HLLL. The first or third pulse combiner (120 of FIG. 10B or 420 of FIG. 17) can generate the first or second reset pulse (PCLR) or (ACLR). In the embodiment described herein, since the consecutive 4-bit information of the test information data (TD) corresponds to the predetermined test rest information, the reset detection signal HIT2 can be generated by the second reset pulse generator 400.

At interval t1 to t2, the second reset pulse (ACLR) can be generated using the reset detection signal HIT2.

At interval t2 to t3, the second reset pulse (ACLR) can be activated, and the previously activated second and fifth test mode selection signals (TM<2>) and (TM<5>) can be reset by the second reset pulse (ACLR). Here, the second and fifth test mode selection signals (TM<2>) and (TM<5>) are examples of the activated multiple test modes. It will be apparent that other test mode selection signals may be performed. In addition, only one of the second and fifth test mode selection signals (TM<2>) and (TM<5>) can be independently performed. Accordingly, the activated multiple test mode selection signal can be reset using the second reset pulse (ACLR).

As described above, the test circuit according to the embodiment described herein can be performed by applying a new test information data through the NC pin several times. That is, if a specific test mode can be selected and performed, a pulse-shaped reset signal for resetting a test mode maintenance signal can be generated to be ready for receiving a new test mode data. However, the reset signal can be generated to have a pulse shape, so that the new test information data can be recognized. Accordingly, the test circuit can perform a multiple test mode.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A test circuit, comprising:
    a first reset pulse generator configured to generate a first reset pulse when a test mode selection signal or a power-up signal is activated;
    a test mode maintenance signal generator configured to provide a test mode maintenance signal activated in response to test information data received as a predetermined consecutive test information data, wherein the test mode maintenance signal is inactivated by the first reset pulse;
    a second reset pulse generator configured to generate a second reset pulse when the test information data is received as a predetermined test mode reset data or when the power-up signal is activated; and
    a test mode selection signal generator configured to receive a shifted test information data provided from the test mode maintenance signal generator and the test mode maintenance signal and to generate a specific test mode selection signal, an activation of the specific test mode selection signal being controlled by the second reset pulse,
    wherein different types of the test modes are operated according to the test information data.

2. The test circuit of claim 1, wherein the test mode maintenance signal generator is triggered at a rising edge of the first reset pulse to reset the test mode maintenance signal to be in a non-activation state.

3. The test circuit of claim 1, wherein the test mode selection signal generator is triggered at a rising edge of the second reset pulse to reset the test mode selection signal to be in a non-activation state.

4. The test circuit of claim 1, wherein the test information data is a serial data of a test mode entry data for starting a test mode and another test mode data that is specific test mode information of a specific test mode to be performed.

5. The test circuit of claim 1, wherein the first reset pulse generator comprises:
    a test mode signal combiner configured to generate a test mode activation signal when at least one test mode selection signal is activated and to output a clear signal having an activation state maintained by the activated test mode activation signal; and
    a first pulse generator configured to generate a pulse-shaped first reset pulse signal using the clear signal and the power-up signal.

6. The test circuit of claim 5, wherein the test mode signal combiner comprises:
    a combiner including a logical gate configured to combine the test mode selection signals and to provide the test mode activation signal; and
    a circuit configured to output the clear signal triggered and activated at a rising edge of the test mode activation signal and to maintain an activated state of the clear signal up to the next rising edge of the test mode activation signal.

7. The test circuit of claim 5, wherein the first pulse generator comprises:

a delay unit configured to combine the clear signal and an inversely delayed signal of the clear signal to generate a pulse signal.

8. The test circuit of claim 1, wherein the second reset pulse generator comprises:
a third multiplex pulse generator configured to store the test information data and to sequentially shift the stored test information data to generate a plurality of pulse signals; and
a third pulse combiner configured to receive the plurality of the pulse signals and the power-up signal and to generate the second reset pulse using a reset detection signal generated when the plurality of the pulse signals correspond to the predetermined test mode reset data.

9. The test circuit of claim 8, wherein the third pulse combiner comprises:
a combiner configured to combine the plurality of the pulse signals and to provide the reset detection signal; and
a delay unit configured to combine the reset detection signal and an inversely delayed signal of the reset detection signal to generate a pulse signal.

10. The test circuit of claim 1, wherein the test mode maintenance signal generator comprises:
a first multiplex pulse generator configured to store the test information data and to sequentially shift the stored test information data to generate a plurality of pulse signals; and
a first pulse combiner configured to combine the plurality of the pulse signals to generate a test mode detection signal when the plurality of the pulse signals correspond to the predetermined test mode entry data and to provide the test mode maintenance signal triggered at a rising edge of the test mode detection signal.

11. The test circuit of claim 1, wherein the test mode selection signal generator comprises:
a second multiplex pulse generator configured to store a data combined with the test information data and the test mode maintenance signal and to sequentially shift the stored test information data to generate a plurality of pulse signals; and
a second pulse combiner configured to receive the plurality of the pulse signals to provide the test mode selection signal triggered and activated by a counter pulse when satisfying the number of predetermined test mode clock periods and reset by the second reset pulse.

12. The test circuit of claim 11, wherein the test mode selection signal generator further comprises a counter pulse generator configured to generate the counter pulse in synchronization with the clock signal when satisfying the minimum number of clock periods for recognizing the test information data during an interval at which the test mode maintenance signal is activated.

13. A test circuit for performing multiple test modes, comprising:
a first reset pulse generator configured to generate a first reset pulse when a test mode selection signal or a power-up signal is activated, and to have an active state maintained during an activation interval having a pulse width;
a test mode maintenance signal generator configured to maintain the activation state when a test information data is received as a predetermined test mode entry data and then to generate a test mode maintenance signal reset inactivated by the first reset pulse, the test mode maintenance signal being in a reset state during the activation interval of the first reset pulse;

a second reset pulse generator configured to generate a second reset pulse in response to the test information data when a reset detection signal or the power-up signal is activated; and
a test mode selection signal generator configured to receive a shifted test information data provided from the test mode maintenance signal generator during an interval at which the test mode maintenance signal is activated and to generate a specific test mode selection signal, the activated test mode selection signal being reset to be in a non-activation state by the second reset pulse,
wherein different types of the test modes are operated according to the test information data.

14. The test circuit of claim 13, wherein the test mode maintenance signal generator is triggered at a rising edge of the first reset pulse to reset the test mode maintenance signal to be in a non-activation state.

15. The test circuit of claim 13, wherein the test mode selection signal generator is triggered at a rising edge of the second reset pulse to reset the test mode selection signal to be in a non-activation state.

16. The test circuit of claim 13, wherein the test information data is a serial data of a test mode entry data for starting a test mode and another test mode data that is information of a specific test mode to be performed.

17. The test circuit of claim 13, wherein the first reset pulse generator comprises:
a test mode signal combiner configured to generate a test mode activation signal when at least one test mode selection signal is activated and to output a clear signal having an activation state maintained by the activated test mode activation signal; and
a first pulse generator configured to generate a pulse-shaped the first reset pulse signal using the clear signal and the power-up signal.

18. The test circuit of claim 17, wherein the test mode signal combiner comprises:
a combiner including a logical gate configured to combine the test mode selection signals and to provide the test mode activation signal; and
a circuit configured to output the clear signal triggered and activated at a rising edge of the test mode activation signal and to maintain an activated state of the clear signal up to the next rising edge of the test mode activation signal.

19. The test circuit of claim 17, wherein the first pulse generator comprises a delay unit configured to combine the clear signal and an inversely delayed signal of the clear signal to generate a pulse signal.

20. The test circuit of claim 13, wherein the second reset pulse generator comprises:
a third multiplex pulse generator configured to store the test information data and to sequentially shift the stored test information data to generate a plurality of pulse signals; and
a third pulse combiner configured to receive the plurality of the pulse signals and the power-up signal and to generate the second reset pulse using a reset detection signal generated when the plurality of the pulse signals correspond to the predetermined test mode reset data.

21. The test circuit of claim 20, wherein the third pulse combiner comprises:
a combiner configured to combine the plurality of the pulse signals and to provide the reset detection signal; and
a delay unit configured to combine the reset detection signal and an inversely delayed signal of the reset detection signal to generate a pulse signal.

22. The test circuit of claim 13, wherein the test mode maintenance signal generator comprises:
- a first multiplex pulse generator configured to store the test information data and to sequentially shifting the stored test information data to generate a plurality of pulse signals; and
- a first pulse combiner configured to combine the plurality of the pulse signals to generate a test mode detection signal when the plurality of the pulse signals correspond to a predetermined test mode entry data and to provide the test mode maintenance signal triggered at a rising edge of the test mode detection signal.

23. The test circuit of claim 13, wherein the test mode selection signal generator comprises:
- a second multiplex pulse generator configured to store a data combined with the test information data and the test mode maintenance signal and to sequentially shifting the stored test information data to generate a plurality of pulse signals; and
- a second pulse combiner configured to receive the plurality of the pulse signals to provide the test mode selection signal triggered and activated by a counter pulse when satisfying the number of predetermined test mode clock periods and reset by the second reset pulse.

24. The test circuit of claim 23, wherein the test mode selection signal generator further comprises a counter pulse generator configured to generate the counter pulse in synchronization with the clock signal when satisfying the minimum number of clock periods for recognizing the test information data during an interval at which the test mode maintenance signal is activated.

* * * * *